(12) United States Patent
Mukasa et al.

(10) Patent No.: US 6,756,931 B2
(45) Date of Patent: Jun. 29, 2004

(54) ELECTROMAGNETIC WAVE ABSORBER

(75) Inventors: Koichi Mukasa, Sapporo (JP);
Teruyuki Tsunabuchi, Supporo (JP);
Kazuhisa Sueoka, Sapporo (JP)

(73) Assignee: Hokkaido University, Sapporo (JP)

( * ) Notice: Subject to any disclaimer, the term of this patent is extended or adjusted under 35 U.S.C. 154(b) by 0 days.

(21) Appl. No.: 10/612,050

(22) Filed: Jul. 3, 2003

(65) Prior Publication Data

US 2004/0104836 A1 Jun. 3, 2004

(30) Foreign Application Priority Data

Jul. 18, 2002 (JP) ........................................ 2002-209857
Dec. 18, 2002 (JP) ........................................ 2002-367057

(51) Int. Cl.[7] .............................................. H01Q 17/00
(52) U.S. Cl. .............................................. 342/1; 342/4
(58) Field of Search ............................... 342/1, 2, 3, 4, 342/175

(56) References Cited

U.S. PATENT DOCUMENTS

| | | | | |
|---|---|---|---|---|
| 5,198,138 A | * | 3/1993 | Yamamoto et al. | ...... 252/62.54 |
| 5,381,149 A | * | 1/1995 | Dougherty et al. | ............ 342/1 |
| 6,630,414 B1 | * | 10/2003 | Matsumoto | .................... 442/1 |
| 2004/0007169 A1 | * | 1/2004 | Ohtsu et al. | .................. 117/84 |

OTHER PUBLICATIONS

"Application of a microgenetic algorithm (MGA) to the design of broadband microwave absorbers using multiple frequency selective surface screens buried in dielectrics", Chakravarty, S. et al; vol.: 50, Issue: 3, Mar '02 Ps:284–296.*

"Robust design of absorbers using genetic algorithms and the finite element–boundary integral method", Suomin Cui; Weile, D.S.; Antennas and Propagation Society International Symposium, 2002. IEEE, vol.: 1, Jun. 16–21, 2002 pp.: 326–329.*

"Incombustible electromagnetic wave absorber made of nonwoven ceramic fibers", Hatakeyama, KI.; Togawa, H.; Electromagnetic Compatibility, IEEE Transactions on , vol.: 40 , Issue: 1, Feb. 1998 pp.: 27–32.*

"Broadband plasma absorber", Vidmar, R.J.; Plasma Science, 1990. IEEE Conference Record—Abstracts., 1990 IEEE International Conference on, May 21–23, 1990 pp. 150.*

* cited by examiner

Primary Examiner—John B. Sotomayor
(74) Attorney, Agent, or Firm—Crowell & Moring LLP

(57) ABSTRACT

An electromagnetic wave absorber including: a porous substrate having a large number of pores piercing the porous substrate; and an absorbent film formed on circumferential surfaces of the pores and constituted by a mixture of an electromagnetic wave absorbing filler and an electromagnetic wave absorving high-molecular material, wherein the pores are not blocked with the absorbent film so that the pores are permeable to gas. Accordingly, the electromagnetic wave absorber is high in electromagnetic wave absorbing performance, can be made thin and lightweight and is so excellent in reliability that the electromagnetic wave absorbing performance can be offered over a very broad range.

16 Claims, 21 Drawing Sheets

ELECTRIC FIELD SHIELDING CHARACTERISTIC (KEC METHOD)

ELECTROMAGNETIC WAVE ABSORBER

BACKGROUND OF THE INVENTION

1. Field of the Invention

The present invention relates to an electromagnetic wave absorber which can be used in various fields, e.g., the electronic/electrical field of various kinds of electronic apparatuses such as a computer and a television set, communication apparatuses, etc., the constructional material field of shielded buildings, shielded facilities, etc., and the field of human body protecting goods.

2. Description of the Related Art

It is an urgent necessity to take measures against electromagnetic interference with the recent remarkable advance of performance of various kinds of electronic apparatuses, communication apparatuses, etc. Specifically, examples of electromagnetic interference include a ghosting phenomenon of a television set caused by electric wave reflected by a high-rise building, a mirror image phenomenon of a radar disturbing the operation of an automobile, a train, etc., and a wrong operation of medical equipment caused by electric wave issued from a mobile communication apparatus such as a portable telephone set.

Further, these apparatuses are defenseless against TEMPEST (information technique by which electromagnetic wave leaked from a personal computer or the like can be monitored at a place far by 100 m or more).

A substrate such as a foamed urethane resin impregnated or coated with a carbon material is used popularly as a conventional electromagnetic wave absorber. Absorption of electromagnetic wave is performed in such a manner that the electromagnetic wave absorbing material such as a carbon material absorbs electromagnetic wave and converts electromagnetic energy of the electromagnetic wave into heat energy. On this occasion, the electromagnetic wave absorbing material generates heat. For this reason, when strong electromagnetic wave is received, the quantity of heat generated in the electromagnetic wave absorbing material becomes large. Hence, there is a problem that the foamed urethane resin as the substrate may be deformed thermally, melted or ignited (explosively burned at 600° C. or higher) or may produce a poisonous gas.

For example, as shown in FIG. 40, an electromagnetic wave absorber 100 used in an electromagnetic anechoic chamber has a base 101, and a large number of pyramidal portions 102 provided on the base 101. The height H of the electromagnetic wave absorber 100 is from the order of tens of cm to the order of m. For this reason, the space occupied by the electromagnetic wave absorber 100 in the anechoic chamber is so large that the space utilization factor in the chamber is worsened. Moreover, the electromagnetic wave absorber 100 is thick and heavy. In addition, there is a disadvantage that the electromagnetic wave absorber 100 is combustible as described above.

Moreover, the technical field requiring such an electromagnetic wave absorber has extended over a very broad range in recent years. The electromagnetic wave absorber is applied to a range of from the frequency band of KHz to the frequency band of GHz of millimeter wave.

In order to eliminate the disadvantages in the related art, an object of the invention is to provide an electromagnetic wave absorber which is high in electromagnetic wave absorbing performance, which can be made thin and lightweight and which is so excellent in reliability that the electromagnetic wave absorbing performance can be offered over a very broad range.

SUMMARY OF THE INVENTION

In order to achieve the object, according to first means of the invention, there is provided an electromagnetic wave absorber including: a porous substrate having a large number of pores piercing the porous substrate; and an absorbent film formed on circumferential surfaces of the pores and constituted by a mixture of an electromagnetic wave absorbing filler and an electromagnetic wave absorbing high-molecular material, wherein the pores are not blocked with the absorbent film so that the pores are permeable to gas.

According to second means of the invention, there is provided an electromagnetic wave absorber including: a porous substrate having a large number of pores piercing the porous substrate; and incombustible or flame-retardant particles having pores into which filamentary carbon adheres, the pores of the porous substrate being filled with the incombustible or flame-retardant particles.

According to third means of the invention, there is provided an electromagnetic wave absorber including: a porous substrate having a large number of pores piercing the porous substrate; an absorbent film formed on circumferential surfaces of the pores and constituted by a mixture of an electromagnetic wave absorbing filler and an electromagnetic wave absorbing high-molecular material; and incombustible or flame-retardant particles having pores into which filamentary carbon adheres, the absorbent film-coated pores of the porous substrate being filled with the incombustible or flame-retardant particles.

According to fourth means of the invention, there is provided an electromagnetic wave absorber as defined in any one of the first through third means, wherein the porous substrate is made of either of an electromagnetic wave shielding material and an electromagnetic wave absorbing material.

According to fifth means of the invention, there is provided an electromagnetic wave absorber as defined in any one of the first through third means, wherein the absorbent film is constituted by a laminate of layers of absorbent films different in electromagnetic wave absorbing filler content.

According to sixth means of the invention, there is provided an electromagnetic wave absorber as defined in any one of the first through third means, further including a thin layer containing electromagnetic wave absorbing metal or carbon and provided so as to overlap the absorbent film.

According to seventh means of the invention, there is provided an electromagnetic wave absorber as defined in any one of the first through sixth means, wherein the porous substrate has a honeycomb structure.

According to eighth means of the invention, there is provided an electromagnetic wave absorber as defined in any one of the first through seventh means, wherein an axial direction of each of the pores in the porous substrate is inclined to a plane of the porous substrate.

According to ninth means of the invention, there is provided an electromagnetic wave absorber as defined in any one of the first through third means, wherein the electromagnetic wave absorbing high-molecular material is a modified polyester resin constituted by a copolymer of isobutyl methacrylate and butyl acrylate.

According to tenth means of the invention, there is provided an electromagnetic wave absorber as defined in any one of the first through ninth means, wherein the electromagnetic wave absorber is constituted by a laminate of sheet-like electromagnetic wave absorbers.

According to eleventh means of the invention, there is provided an electromagnetic wave absorber as defined in the tenth means, the electromagnetic wave absorbers to be laminated are integrally bonded to one another by a modified polyester resin constituted by a copolymer of isobutyl methacrylate and butyl acrylate.

According to twelfth means of the invention, there is provided an electromagnetic wave absorber as defined in any one of the first through ninth means, wherein the electromagnetic wave absorber is coated with incombustible or flame-retardant particles having pores into which filamentary carbon adheres.

According to thirteenth means of the invention, there is provided an electromagnetic wave absorber as defined in any one of the first through ninth means, wherein: the electromagnetic wave absorber is constituted by a laminate of sheet-like electromagnetic wave absorbers; and incombustible or flame-retardant particles having pores into which filamentary carbon adheres are interposed between the sheet-like electromagnetic wave absorbers.

According to fourteenth means of the invention, there is provided an electromagnetic wave absorber as defined in any one of the first through ninth means, wherein: the electromagnetic wave absorber is processed three-dimensionally; and a hollow portion of the processed electromagnetic wave absorber is filled with incombustible or flame-retardant particles having pores into which filamentary carbon adheres.

According to fifteenth means of the invention, there is provided an electromagnetic wave absorber as defined in any one of the first through fourteenth means, wherein the electromagnetic wave absorber is disposed in the periphery of a printed wiring board mounted with electronic parts or in the periphery of electronic parts.

According to sixteenth means of the invention, there is provided an electromagnetic wave absorber as defined in any one of the first through fourteenth means, wherein the electromagnetic wave absorber is used as a constructional material, for example, for constructing a side wall, a ceiling wall, a floor wall, and a partition wall.

DETAILED DESCRIPTION OF THE INVENTION

Figure 1:
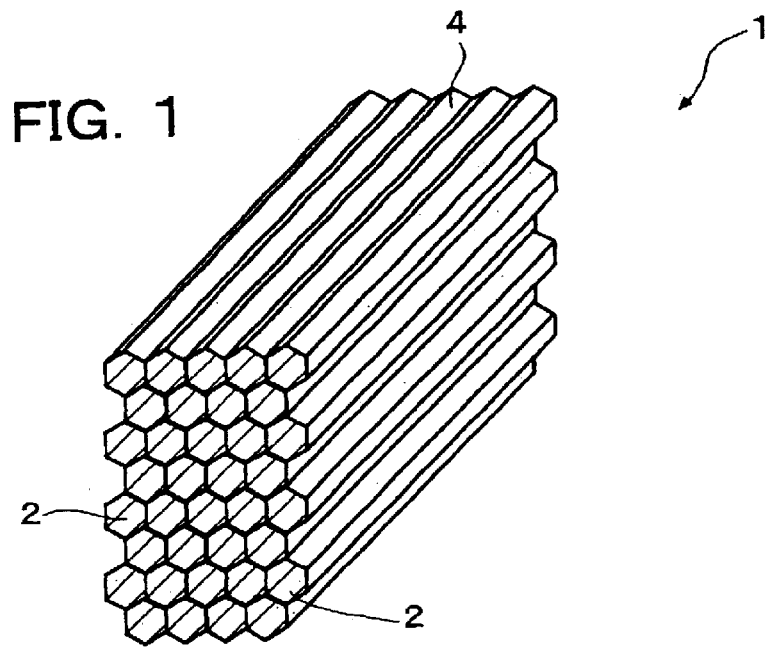
FIG. 1 is a perspective view of a porous block of a honeycomb structure used in an embodiment of the invention.
Figure 2:
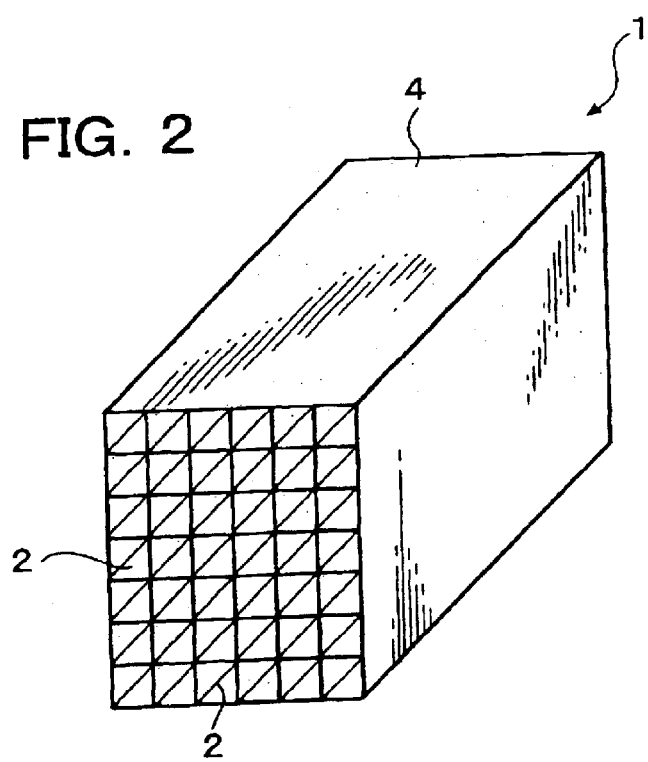
FIG. 2 is a perspective view of a porous block of a lattice structure used in an embodiment of the invention.
Figure 3:
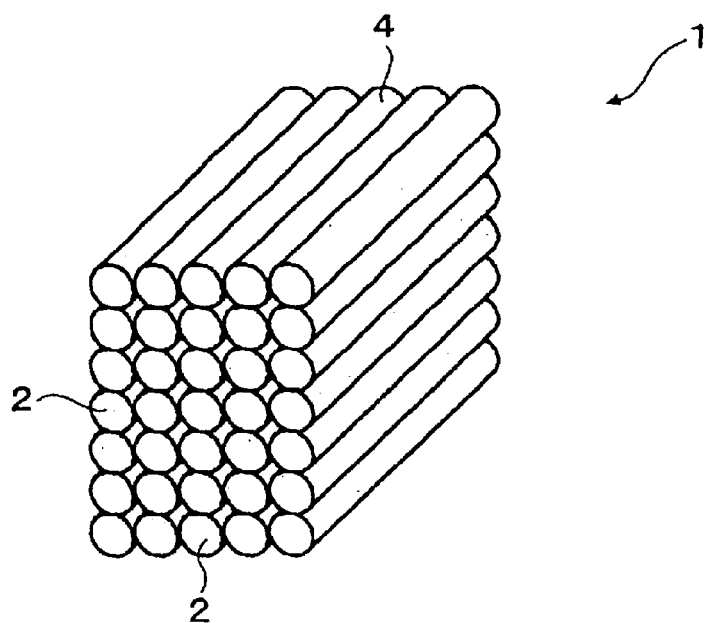
FIG. 3 is a perspective view of a porous block of a further structure used in an embodiment of the invention.

Embodiments of the invention will be described below with reference to the drawings. FIGS. 1 to 3 are perspective views of various kinds of porous blocks 1 used in the invention. FIG. 1 shows a porous block 1 of a honeycomb structure having opening portions each shaped like a hexagon in front view. FIG. 2 shows a porous block 1 of a lattice structure having opening portions each shaped like a quadrangle or a lozenge in front view. FIG. 3 shows a porous block 1 having opening portions each shaped like a circle or an ellipse in front view. In each of FIGS. 1 to 3, the porous block 1 has a large (or limitless) number of pores 2 which extend in parallel with one another from the front to the rear so as to pierce the porous block 1.

The porous block 1 is made of an electromagnetic wave shielding material or an electromagnetic wave absorbing material. Examples of the electromagnetic wave shielding material include a metal such as aluminum, copper, iron or nickel, and an alloy of at least two metals selected from these metals. Examples of the electromagnetic wave absorbing material include carbon and ferrite.

Figure 4:
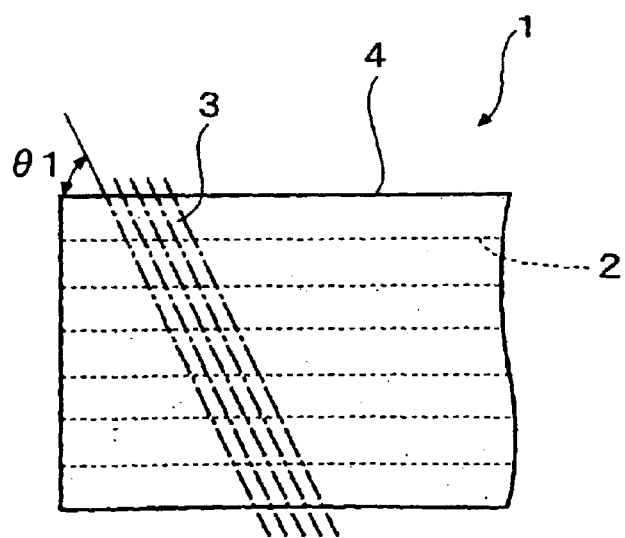
FIG. 4 is a side view for explaining oblique cutting of the porous block.
Figure 5:
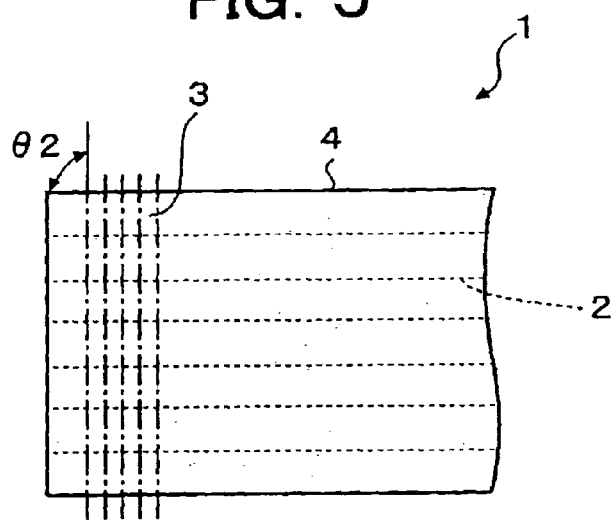
FIG. 5 is a side view for explaining perpendicular cutting of the porous block.

FIGS. 4 and 5 are side views of the porous block 1 showing the way of cutting the porous block 1 into sheet-like porous substrates 3. FIG. 4 shows a state in which the porous block 1 is cut at an inclination angle θ1 (<90°) with respect to an upper surface 4 of the porous block 1. FIG. 5 shows a state in which the porous block 1 is cut at an inclination angle θ2 (=90°) with respect to the upper surface 4 of the porous block 1.

Figure 6:
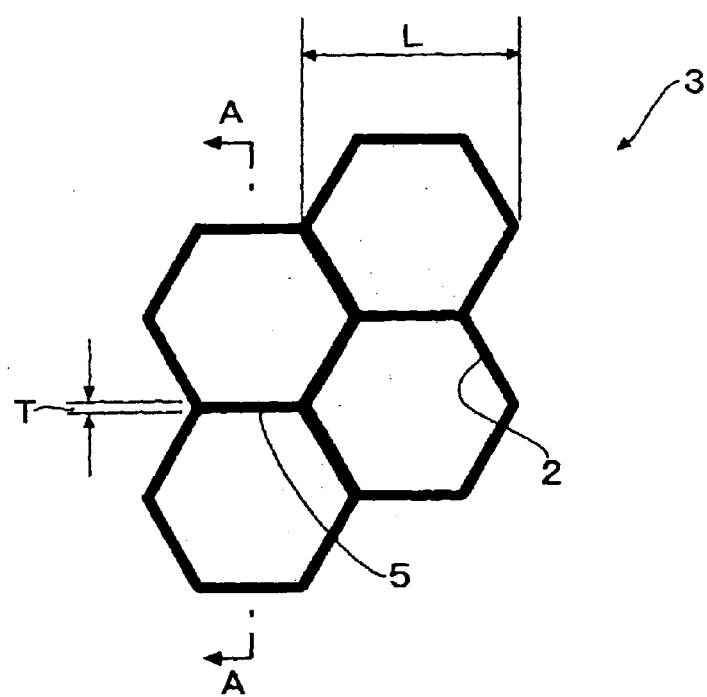
FIG. 6 is a transverse sectional view of a porous substrate having a honeycomb structure.
Figure 7:
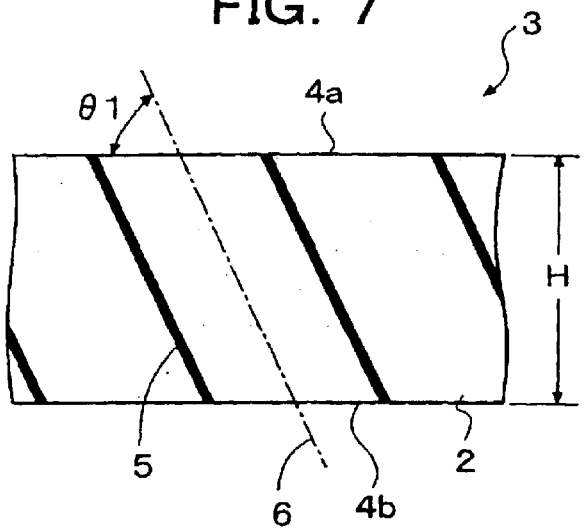
FIG. 7 is a longitudinal sectional view taken along the line A—A in FIG. 6, of the porous substrate obtained by oblique cutting of the porous block.
Figure 8:
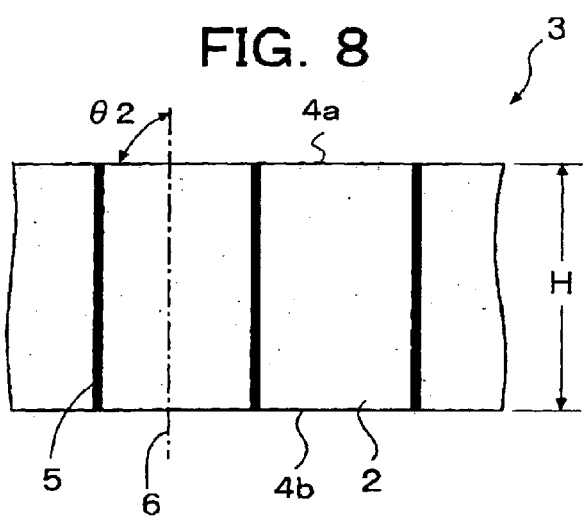
FIG. 8 is a longitudinal sectional view taken along the line A—A in FIG. 6, of the porous substrate obtained by perpendicular cutting of the porous block.

FIG. 6 is a transverse sectional view of one of the sheet-like porous substrates 3 obtained by cutting the porous block 1 of the honeycomb structure shown in FIG. 1. FIGS. 7 and 8 are longitudinal sectional views taken along the line A—A in FIG. 6. FIG. 7 is a longitudinal sectional view of one of the sheet-like porous substrates 3 obtained by the cutting method shown in FIG. 4. FIG. 8 is a longitudinal sectional view of one of the sheet-like porous substrates 3 obtained by the cutting method shown in FIG. 5.

In this embodiment, each sheet-like porous substrate 3 is made of aluminum or an aluminum alloy in consideration of electrically conducting characteristic, moldability, etc. As shown in FIG. 6, the sheet-like porous substrate 3 has a large (or limitless) number of pores 2 each shaped like a hexagon in front view. As shown in FIGS. 7 and 8, each of the pores 2 pierces the sheet-like porous substrate 3 between two planes 4a and 4b parallel with each other. The cell size L (see FIG. 6) of each pore 2 is about 50 µm to about 1,000 µm (e.g., 900 µm in this embodiment). The thickness T (see FIG. 6) of a circumferential wall 5 of each pore 2 is about 10 µm to about 30 µm (e.g., 15 µm in this embodiment). The height H (see FIGS. 7 and 8) of the sheet-like porous substrate 3 is about 1 mm to about 2 mm (e.g. 1.0 mm, 1.5 mm and 1.8 mm in this embodiment).

When the porous block 1 is cut at an inclination angle θ1 (e.g. 45° and 70° in this embodiment) with respect to the upper surface 4 of the porous block 1 as shown in FIG. 4, sheet-like porous substrates 3 are obtained in a state in which the axial direction 6 of each pore 2 is inclined at the inclination angle θ1 (e.g., 45° and 70° in this embodiment) with respect to the planes 4a and 4b as shown in FIG. 7.

On the other hand, when the porous block 1 is cut at an angle θ2 (=90°) with respect to the upper surface 4 of the porous block 1 as shown in FIG. 5, sheet-like porous substrates 3 are obtained in a state in which the axial direction 6 of each pore 2 is perpendicular to the planes 4a and 4b as shown in FIG. 8.

Figure 9:
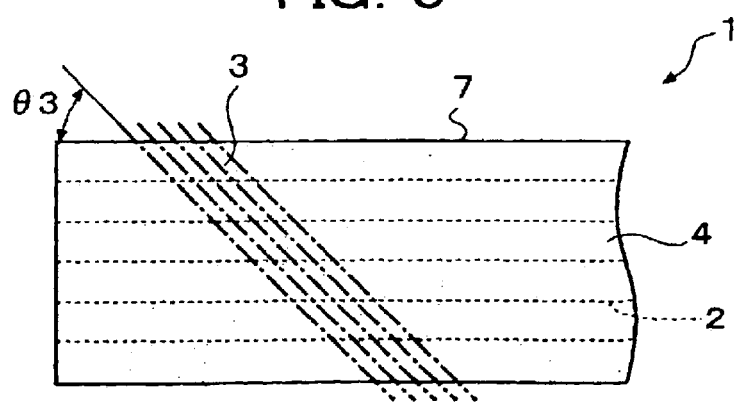
FIG. 9 is a top view for explaining a further example of oblique cutting of the porous block.

FIG. 9 is a top view of the porous block 1 showing a further cutting method for obtaining sheet-like porous substrates 3 from the porous block 1. In the cutting method shown in FIG. 4, the porous block 1 is cut so as to be sliced obliquely. In this example, however, a cutting edge (not shown) is disposed and fixed on the upper surface 4 of the porous block 1 at an inclination angle θ3 with respect to long sides of the porous block 1. When the cutting edge is brought down while the inclination angle θ3 is kept constant, the same sheet-like porous substrate 3 as shown in FIG. 7 is obtained consequently. This cutting method needs no operation but a simple operation of moving the cutting edge up and down vertically, so that this cutting method is more suitable for mass production than the method shown in FIG. 4.

Although the aforementioned example has shown the case where the sheet-like porous substrate 3 is sliced from the porous block 1, one mesh layer or mesh layers made of expanded metal, metal or carbon fiber may be also used as the sheet-like porous substrate.

Because this sheet-like porous substrate 3 is so flexible that it can be folded, it can be processed three-dimensionally into any shape such as a prism of a polygon having three or more sides, a cylinder, a cone, a pyramid or a trapezoid as will be described later.

Figure 10:
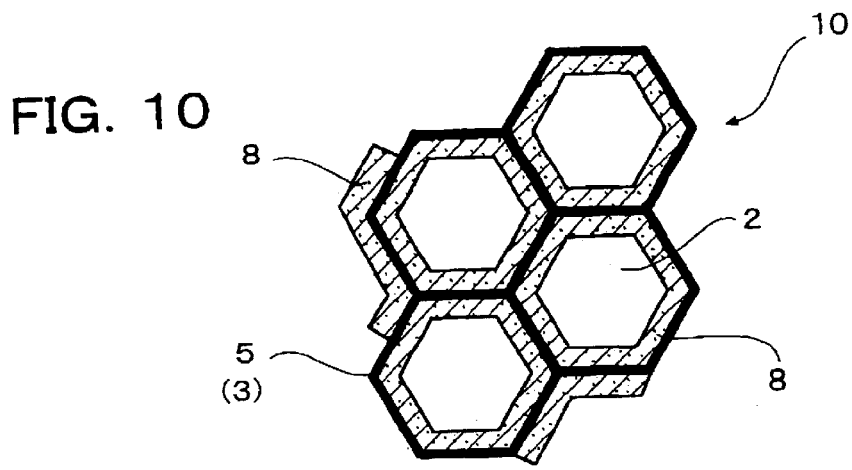
FIG. 10 is a transverse sectional view of an electromagnetic wave absorber according to a first embodiment of the invention.
Figure 11:
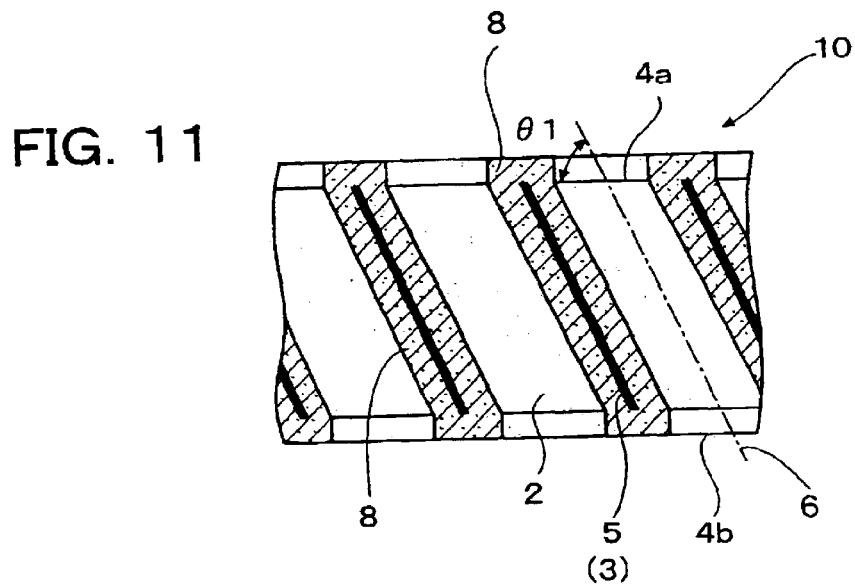
FIG. 11 is a longitudinal sectional view of the electromagnetic wave absorber according to the first embodiment and using the porous substrate depicted in FIG. 7.
Figure 12:
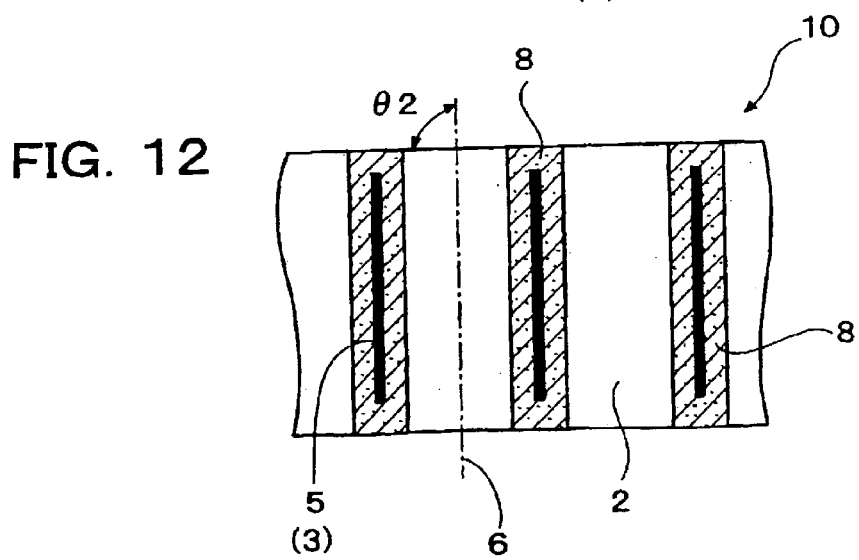
FIG. 12 is a longitudinal sectional view of the electromagnetic wave absorber according to the first embodiment and using the porous substrate depicted in FIG. 8.

As shown in FIGS. 10 to 12, an absorbent film 8 having electromagnetic wave absorbing function is formed substantially uniformly on the planes 4a and 4b of the sheet-like porous substrate 3 and on surfaces (wall surfaces) of the pore circumferential walls 5. The absorbent film 8 is made of a mixture of an electromagnetic wave absorbing filler and an electromagnetic wave absorbing high-molecular material.

Examples of the electromagnetic wave absorbing filler (fine powder) used include copper, aluminum, silver, platinum, zinc, manganese, ferrite, graphite, and graphite-carrying ceramic. For example, spinel-type ferrite such as manganese-zinc ferrite, nickel-zinc ferrite, copper-zinc ferrite or nickel-iron ferrite is used as the ferrite.

Examples of the graphite-carrying ceramic used include alumina ceramic, mullite ceramic, titania ceramic, titanate ceramic, zirconia ceramic, zircon ceramic, and silicon carbide ceramic.

A porous body (e.g., a paper substance such as a corrugated board) capable of exhibiting shape retention due to carbon remaining after baked in an inert atmosphere is impregnated with slurry which contains a high-molecular material (e.g., phenol resin) as a carbon source, and silicon powder. The porous body is baked and carbonized at a temperature of about 900° C. to about 1,300° C. in an inert atmosphere. The carbonized porous body is sintered at about 1,400° C. or higher under reduced pressure or in an inert atmosphere to thereby produce micro-porous silicon carbide. The silicon carbide porous body produced from the aforementioned porous body impregnated with molten silicon at a temperature of about 1,300° C. to about 1,800° C. under reduced pressure or in an inert atmosphere can be used praiseworthily because it is lightweight and has excellent heat resistance, excellent corrosion resistance and excellent thermal shock resistance.

The electromagnetic wave absorbing filler may be used as a single material or as a mixture of materials. The particle size of the electromagnetic wave absorbing filler is selected to be not larger than 3 $\mu$m, preferably not larger than 1 $\mu$m.

For example, a modified polyester resin constituted by a copolymer of isobutyl methacrylate and butyl acrylate (e.g., $\alpha$-methylstylene) is preferably used as the electromagnetic wave absorbing high-molecular material. The composition ratio of isobutyl methacrylate to butyl acrylate in the modified polyester resin is selected to be in a range of from 1/1 to 3/1 in terms of weight ratio.

The modified polyester resin is a condensation polymer having molecular weight of about 300,000 to about 1,000,000 and is a long chain compound having a COOH group but having no OH group, no double bond and no triple bond in a molecule. Accordingly, the modified polyester resin is so excellent in weather resistance that the electromagnetic wave absorbing filler made of a metal such as copper, aluminum or silver can be protected from oxidation for a long term (of 10 years or longer). The modified polyester resin is soluble in an organic solvent such as isopropyl alcohol, kerosine or acetone.

Specifically, there is used a mixture containing 30% by weight of the modified polyester resin dissolved in an organic solvent such as isopropyl alcohol, and 200% by weight to 500% by weight of the electromagnetic wave absorbing filler shaped like super-fine particles and made of a mixture of copper as a main component and aluminum.

The modified polyester resin is a ladder polymer shaped like a ball of wool. Fine particles of the electromagnetic wave absorbing filler are uniformly dispersed and carried in the three-dimensional structure of the ladder polymer so that the electromagnetic wave absorbing filler is protected from oxidation and deterioration for a long term.

A coating solution containing the electromagnetic wave absorbing filler and the electromagnetic wave absorbing high-molecular material is jetted under a high pressure of about 200 Kg/cm² by an airless spray so that the coating solution adheres to the sheet-like porous substrate 3 to thereby, form an absorbent film 8 on surfaces of the sheet-like porous substrate 3 and in pores thereof.

Alternatively, the absorbent film 8 may be formed as follows. The sheet-like porous substrate 3 is put in a vessel provided with an ultrasonic vibrator and filled with the coating solution containing the electromagnetic wave absorbing filler and the electromagnetic wave absorbing high-molecular material. The ultrasonic vibrator is operated so that the solution is fitted to the sheet-like substrate 3 uniformly.

Then, the sheet-like porous substrate 3 is moved into a closed vessel. High-pressure air is supplied into the closed vessel so that the superfluous solution in the inside of the sheet-like porous substrate 3 is discharged instantaneously. Then, the sheet-like porous substrate 3 is heated and dried for a short time (of tens of seconds) by a far-infrared lamp or a halogen lamp to thereby form an absorbent film 8 on surfaces of the sheet-like porous substrate 3 and in pores thereof.

When solidified, the absorbent film 8 becomes electrically conductive and exhibits surface resistivity, for example, of about 0.3 $\Omega$cm to about 1 $\Omega$cm because of a tunnel effect due to metal, graphite carbon, etc. in the inside of the polymer. When metal such as aluminum or carbon is used as the sheet-like porous substrate 3, an electromagnetic wave absorber having electrically conducting characteristic is produced so that all cells have electrically conducting characteristic through the porous substrate 3. The thickness of the absorbent film 8 is selected to be in a range of from 30$\mu$m to 200 $\mu$m and preferably in a range of from 50$\mu$m to 100 $\mu$m. It is effective that the absorbent film 8 is of a mono-layer structure or of a multi-layer structure. In the case of a multi-layer structure, it is also effective to change the electromagnetic wave absorbing filler content in accordance with the layer or change the electromagnetic wave absorbing filler content and the thickness in accordance with necessity.

As shown in FIGS. 10 to 12, the pores 2 of the sheet-like porous substrate 3 are not blocked in spite of the formation of the absorbent film 8, that is, the electromagnetic wave absorber has such permeability (see-through) that gas can pass through the pores 2 freely.

Figure 13:
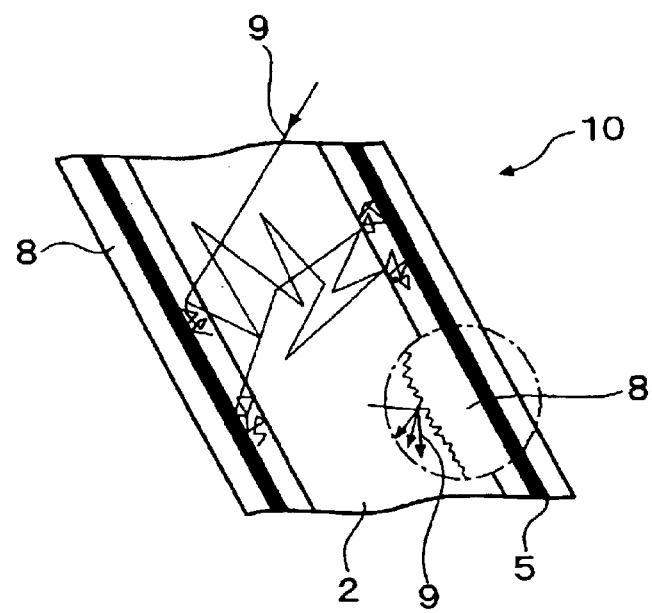
FIG. 13 is a view for explaining the theory of electromagnetic wave absorption by the electromagnetic wave absorber according to an embodiment of the invention.

FIG. 13 is a theoretical view for explaining the absorbing function of the electromagnetic wave absorber according to this embodiment. Electromagnetic wave 9 entering each pore (cell) 2 behaves as follows.

(1) Irregular reflection is repeated in the wall surface of the pore (cell) 2 so that electromagnetic wave is absorbed by molecular vibration of high-molecular material including filler such as copper, aluminum or silver. When the porous substrate 3 has a honeycomb structure, six wall surfaces opposite to each other are provided so that irregular reflection (pseudo-Brownian motion [molecular vibration]) is repeated efficiently with the result that electromagnetic wave is efficiently absorbed by molecular vibration of high-molecular material including filler such as copper, aluminum or silver.

(2) As shown in the inside of a circle in FIG. 13, a limitless number of fine bumps are formed on a surface of the absorbent film 8, so that the specific surface area of the absorbent film 8 increases in a range of from the order of thousands of times to the order of ten thousands of times compared with that of a flat surface. Accordingly, irregular reflection occurs easily so that electromagnetic wave is easily absorbed by molecular vibration of high-molecular material including filler such as copper, aluminum or silver.

(3) Because electromagnetic wave absorbing high-molecules in the absorbent film 8 are lumps of carbon having a three-dimensional wool ball structure (three-dimensional: matrix structure due to COOH), electromagnetic wave can be absorbed efficiently.

(4) Irregular reflection can be made efficiently by the fine filler dispersed and held in the absorbent film 8 so that electromagnetic wave is efficiently absorbed by molecular vibration of high-molecular material including filler such as copper, aluminum or silver.

(5) Electromagnetic wave resonates with the sheet-like porous substrate 3 made of aluminum or the like.

(6) Electromagnetic wave is attenuated by irregular reflection in the inside of the sheet-like porous substrate 3 made of aluminum or the like because irregular reflection contributes to absorption of electromagnetic wave by molecular vibration of high-molecular material including filler such as copper, aluminum or silver.

As shown typically in FIG. 13, while both irregular reflection like Brownian motion and resonance occur, electromagnetic wave energy is absorbed efficiently by the synergistic action of the paragraphs (1) to (6).

When a porous substrate 3 formed so that the axial direction 6 of the pores 2 is inclined to the planes 4a and 4b of the porous substrate 3 as shown in FIG. 7 or 11 is used, each pore 2 (absorbent film 8) in the porous substrate 3 not varied in thickness becomes substantially large in length and the circumferential wall 5 of each pore 2 is inclined compared with the case of a porous substrate 3 formed so that the axial direction 6 of the pores 2 is perpendicular to the planes 4a and 4b of the porous substrate 3 as shown in FIG. 8 or 12. Accordingly, irregular reflection of electromagnetic wave occurs easily, so that electromagnetic wave can be confined easily. Accordingly, the porous substrate 3 shown in FIG. 7 or 11 can be used praiseworthily.

Figure 14:
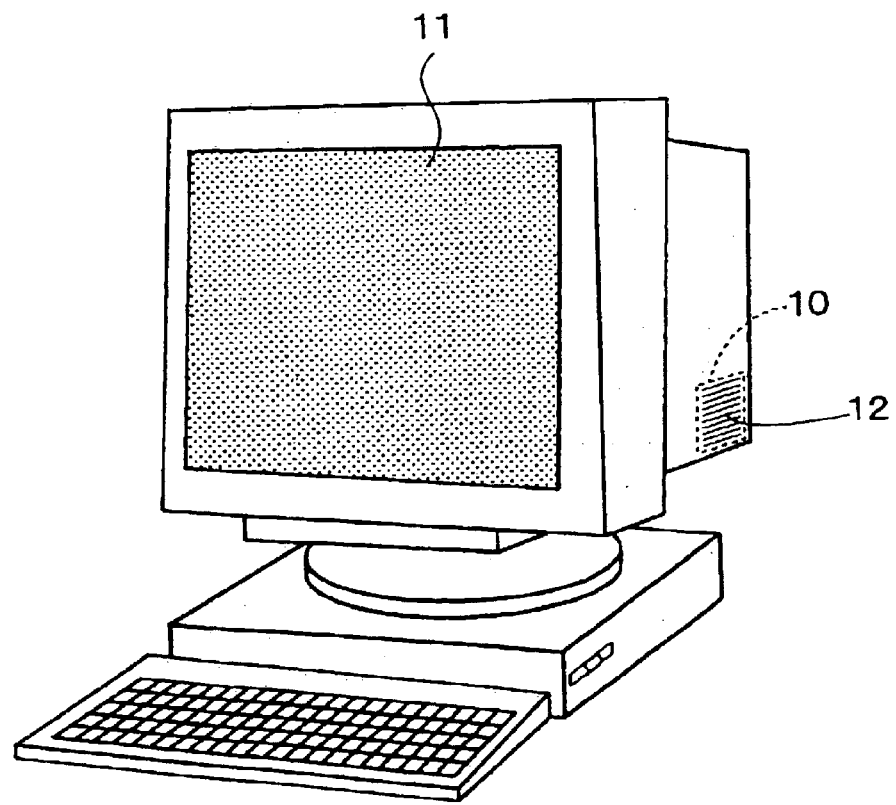
FIG. 14 is a perspective view of an electronic apparatus provided with the electromagnetic wave absorber having gas-permeability according to an embodiment of the invention.

FIG. 14 is a view showing an applied example of the electromagnetic wave absorber having gas permeability. A sheet-like electromagnetic wave absorber 10 is fixed to a casing inside of a vent hole 12 provided in an electronic apparatus 11 such as a personal computer. There is an increasing tendency for the casing of the electronic apparatus 11 to be converted into a metal casing for the double purpose of taking measures against electromagnetic wave noise and facilitating recycling. The vent hole 12 is formed in a side or rear surface of the casing for radiating heat generated from various kinds of electronic devices in the electronic apparatus 11. For this reason, electromagnetic wave entering the electronic apparatus 11 through the vent hole 12 exerts a bad influence on the electronic devices or electronic wave generated in the electronic apparatus 11 and leaked out through the vent hole 12 exerts a bad influence on peripheral apparatuses or the like.

Because the electromagnetic wave absorber 10 according to this embodiment is thin and permeable to gas, heat can be radiated without hindrance. Moreover, because the electromagnetic wave absorber 10 has an electromagnetic wave absorbing function, electromagnetic wave can be effectively prevented from entering and exiting through the vent hole 12.

Figure 15:
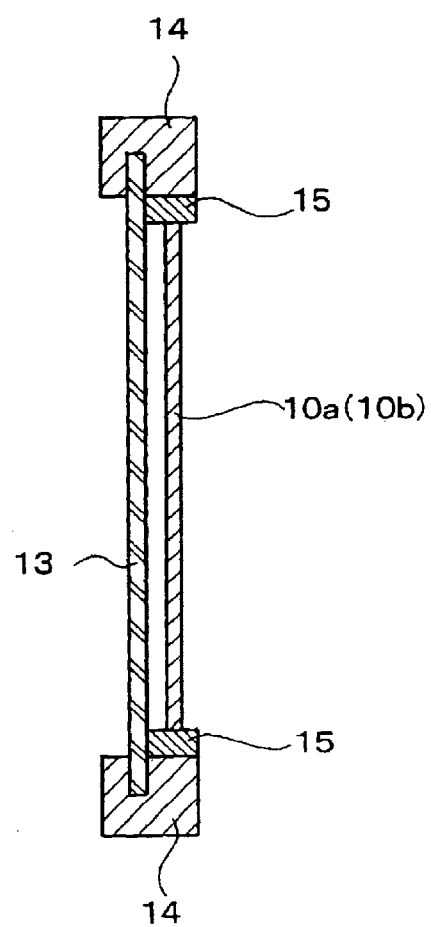
FIG. 15 is a sectional view of a window (and its vicinity) provided with the electromagnetic wave absorber having see-through characteristic according to an embodiment of: the invention.
Figure 16:
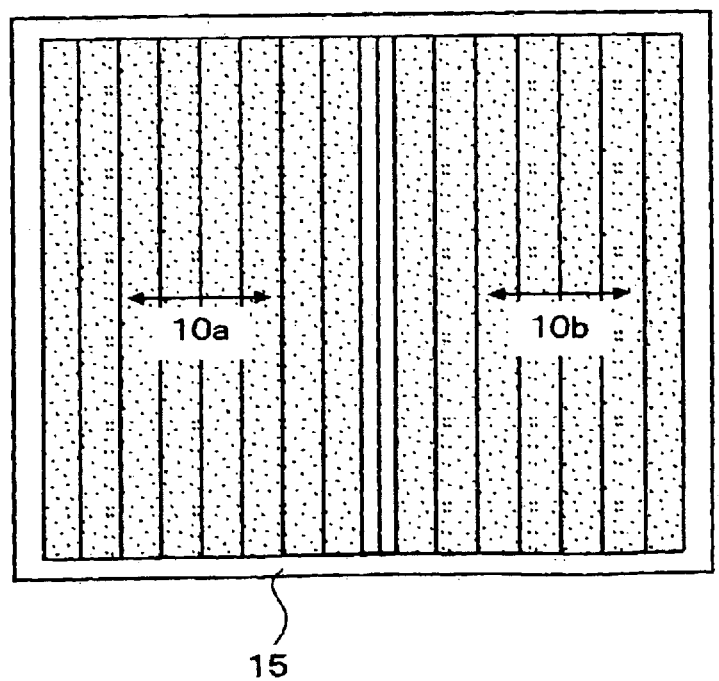
FIG. 16 is a front view of the electromagnetic wave absorber viewed from the room side.

FIGS. 15 and 16 are views showing an applied example of the electromagnetic wave absorber having see-through characteristic. FIG. 15 is a sectional view of a window and its vicinity. FIG. 16 is a front view of the electromagnetic wave absorber viewed from a room. For example, a glass window 13 used in an electromagnetic wave-shielded room such as a high-rise intelligent building room, a radar control room, an executive room, an accountants' room, a computer room, a production control room of a factory, a train traffic control room or a battleship room is fixed to a window frame 14. Sheet-like electromagnetic wave absorbers 10a and 10b are disposed on the indoor side of the glass window 13. The electromagnetic wave absorbers 10a and 10b are held in an electrically conductive lattice metal frame 15 as if shoji screens were stretched. The electromagnetic wave absorbers 10a and 10b can be opened and closed in directions of the arrows as occasion demands.

When an electromagnetic wave absorber formed so that the axial direction 6 of each pore 2 is inclined to the planes 4a and 4b as shown in FIG. 11 is used as each of the electromagnetic wave absorbers 10a and 10b, it is possible to obtain clear sight of the sky on the basis of external light taken into the room from above, obtain clear sight of the lower road on the basis of external light taken into the room from below, obtain clear sight of the left view on the basis of external light taken into the room from left or obtain clear sight of the right view on the basis of external light taken into the room from right, in accordance with the direction of inclination of each pore 2.

A photograph, a picture, etc. can be printed on each of the electromagnetic wave absorbers 10a and 10b. The shape of each of the electromagnetic wave absorbers 10a and 10b can be designed optionally. Besides the rectangular shape, a circular shape, a polygonal shape, a heart shape, a star shape, a diamond shape, etc. may be used as the shape of each of the electromagnetic wave absorbers 10a and 10b. In addition, the axial directions 6 of the pores 2 may be changed to provide a difference in intensity of light entering the room to thereby improve an interior decoration effect.

Figure 17:
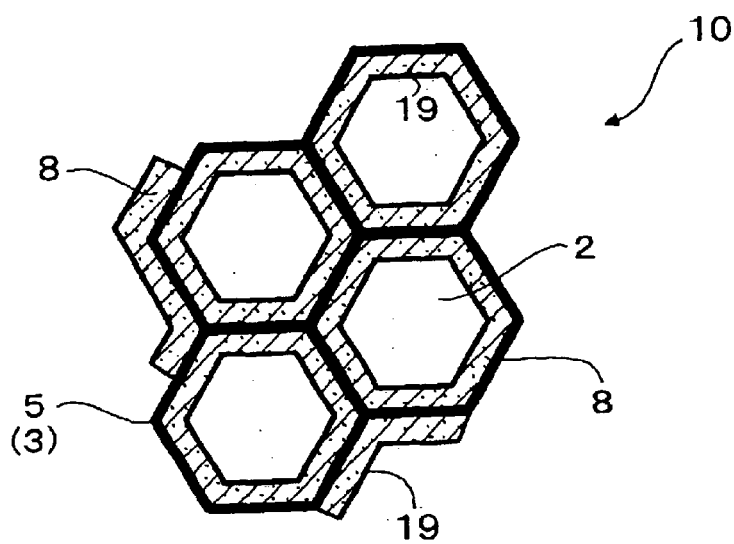
FIG. 17 is a transverse sectional view of the electromagnetic wave absorber according to a second embodiment of the invention.
Figure 18:
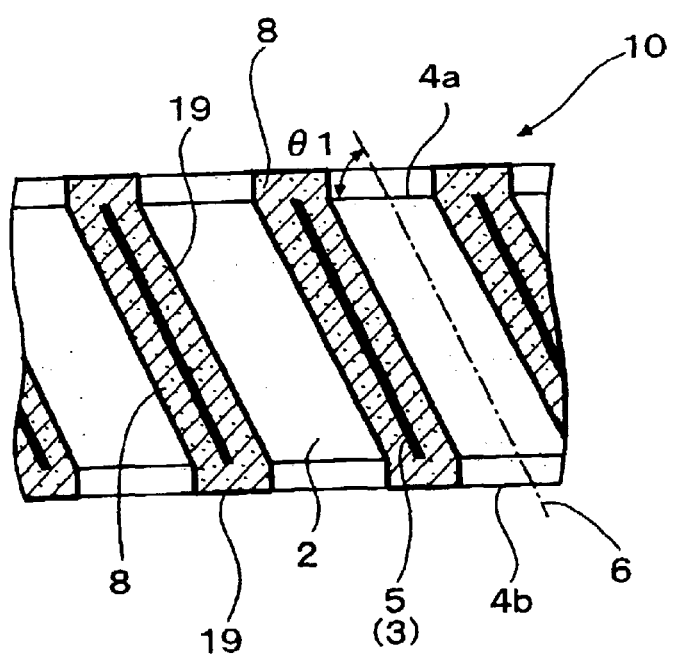
FIG. 18 is a longitudinal sectional view of the electromagnetic wave absorber according to the second embodiment of the invention.

FIGS. 17 and 18 are views for explaining an electromagnetic wave absorber according to a second embodiment of the invention. FIG. 17 is a transverse sectional view of the electromagnetic wave absorber. FIG. 18 is a longitudinal sectional view of the electromagnetic wave absorber.

The point of difference of this embodiment from the first embodiment is that an amorphous metal film of copper, aluminum, silver, platinum, zinc, manganese, etc. is formed as a thin layer 19 on the absorbent film 8 by a thin-film technique such as CVD, sputtering or ion-plating, or a carbon (graphite) film, a carbon (graphite) -carrying ceramic fine particle film, etc. is formed as a thin layer 19 on the absorbent film 8 by a coating method or the like.

Although this embodiment shows the case where a single thin layer 19 is formed, the invention may be also applied to the case where a plurality of thin layers 19 are formed as a multi-layer. In the latter case, the plurality of thin layers 19 may be made of different materials respectively so that, for example, the first thin layer 19 is made of an amorphous metal film, the second thin layer 19 is made of a carbon film and the third thin layer 19 is made of a carbon- carrying ceramic fine particle film.

Although this embodiment shows a structure in which the thin layer 19 is formed on the absorbent film 8, the invention may be also applied to a multi-layer structure in which a new absorbent film 8 is formed on the thin layer 19 or a new thin layer 19 is further formed on the new absorbent film 8.

Figure 19:
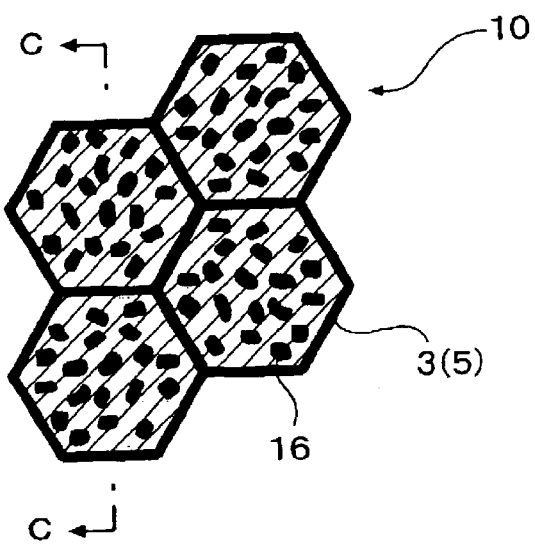
FIG. 19 is a longitudinal sectional view of the electromagnetic wave absorber according to a third embodiment of the invention.
Figure 20:
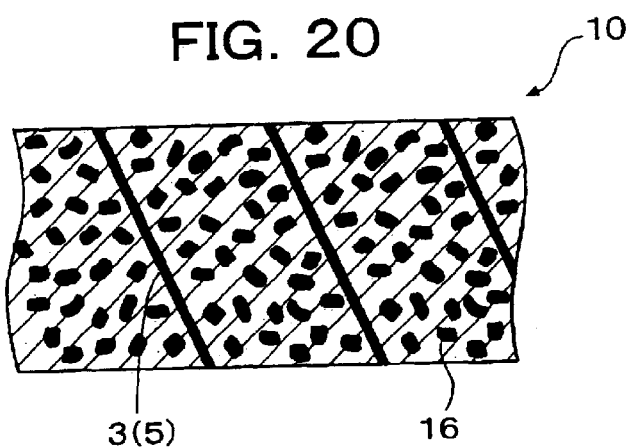
FIG. 20 is a transverse sectional view of the electromagnetic wave absorber according to the third embodiment of the invention.
Figure 21:
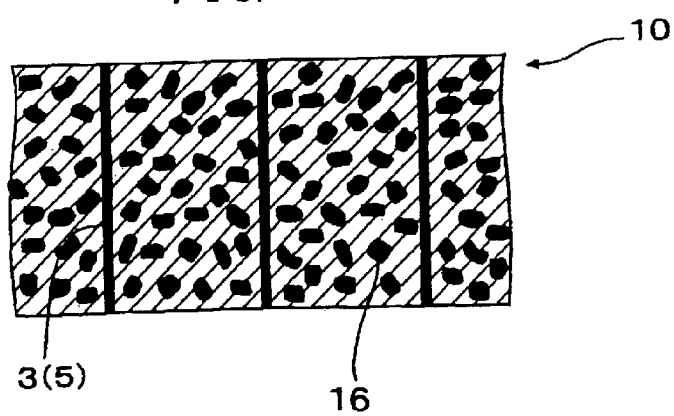
FIG. 21 is a longitudinal sectional view of the electromagnetic wave absorber according to the third embodiment and using the porous substrate depicted in FIG. 8.

FIGS. 19 to 21 are views for explaining examples of an electromagnetic wave absorber according to a third embodiment of the invention. FIG. 19 is a transverse sectional view of the electromagnetic wave absorber. FIGS. 20 and 21 are longitudinal sectional views of examples of the electromagnetic wave absorber.

Also in this embodiment, the sheet-like porous substrate 3 as shown in FIGS. 6 to 8 is used and the pores 2 of the porous substrate 3 are filled with incombustible or flame-retardant fine particles (hereinafter simply referred to as "incombustible fine particles") 16.

The incombustible fine particles 16 contain filamentary carbon adhering to surfaces of the incombustible porous fine particles and in pores thereof. Examples of the material of the incombustible porous fine particles used include clay porous matter, alumina, silica-alumina, silicon carbide porous matter impregnated with molten silicon as described above, silica gel, carbon porous matter, zeolite, and aggregated matter of inorganic fibers such as glass fibers or silica-alumina fibers.

When the incombustible porous fine particles are brought into contact with gaseous hydrocarbon or a gaseous hydrocarbon-containing mixture at a high temperature in the condition that catalytic fine particles are deposited in the pores of the incombustible porous fine porous particles, filamentary carbon can be produced and adhere to the surfaces of the incombustible porous fine particles and in the pores thereof.

For example, a metal such as nickel, cobalt, iron, copper or molybdenum or a mixture of the metal and a precious metal such as platinum, rhodium or silver is used as the catalyst. For example, chain hydrocarbon such as alkane, alkene or alkyne, alicyclic hydrocarbon or aromatic hydrocarbon is used as the hydrocarbon. For example, natural gas or petroleum gas is used as the hydrocarbon-containing mixture. When the incombustible porous fine particles are brought into contact with gaseous hydrocarbon or a gaseous hydrocarbon-containing mixture at a high temperature (e.g., 300° C. to 900° C.) in the condition that catalytic fine particles are carried in the pores of the incombustible porous fine particles, hollow filamentary carbon or helical-structure filamentary carbon is produced and grows up in each pore. The filamentary carbon is a mixture of crystalline carbon and amorphous carbon.

As shown in FIGS. 19 to 21, the incombustible fine particles 16 containing filamentary carbon adhering in the pores of the incombustible fine particles 16 are forced into the pores 2 of the porous substrate 2 to thereby obtain a sheet-like electromagnetic wave absorber 10.

Figure 22:
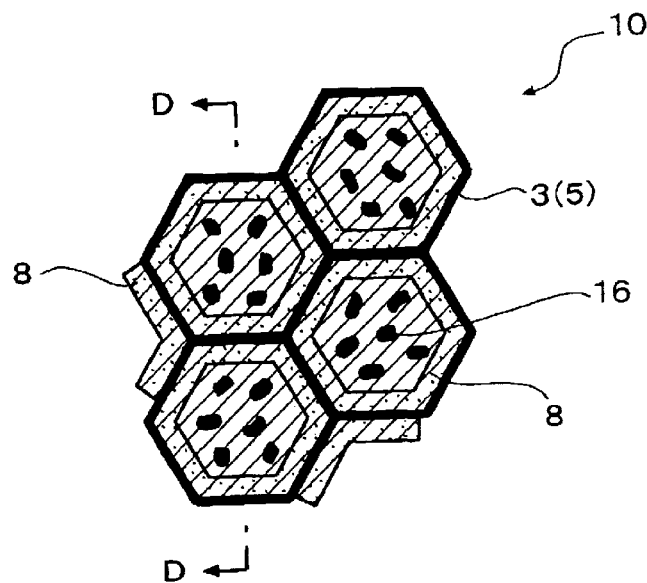
FIG. 22 is a longitudinal sectional view of the electromagnetic wave absorber according to a fourth embodiment of the invention.
Figure 23:
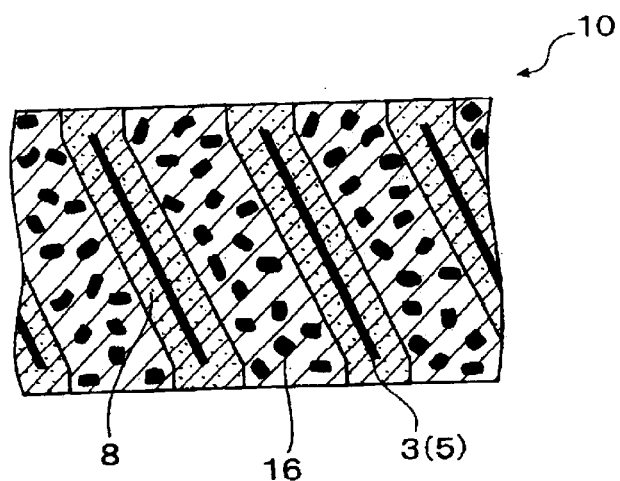
FIG. 23 is a transverse sectional view of the electromagnetic wave absorber according to the fourth embodiment of the invention.
Figure 24:
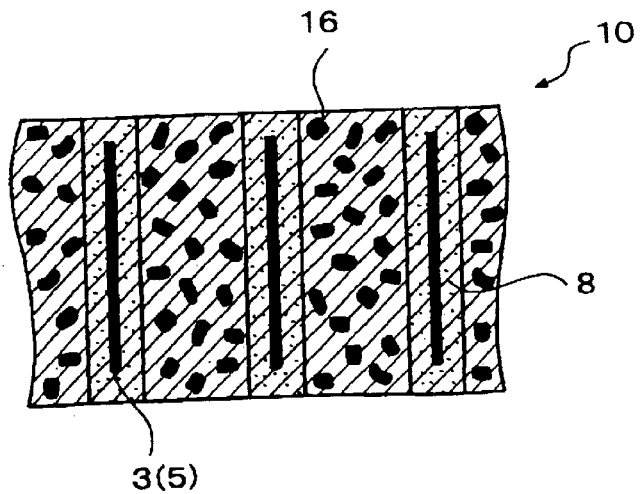
FIG. 24 is a longitudinal sectional view of the electromagnetic wave absorber according to the fourth embodiment and using the porous substrate depicted in FIG. 8.

FIGS. 22 to 24 are views for explaining an electromagnetic wave absorber according to a fourth embodiment of the invention. The point of difference of this embodiment from the first embodiment is that the pores 2 of the porous substrate 3 coated with the absorbent film 8 as shown in FIGS. 10 to 12 are filled with the incombustible fine particles 16 containing filamentary carbon deposed in the pores of the incombustible fine particles 16. Although this embodiment shows the case where the pores 2 of the porous substrate 3 as shown in FIGS. 10 to 12 are filled with the incombustible fine particles 16, the invention may be also applied to the case where the pores 2 of the porous substrate 3 as shown in FIGS. 17 and 18 are filled with the incombustible fine particles 16.

Figure 25:
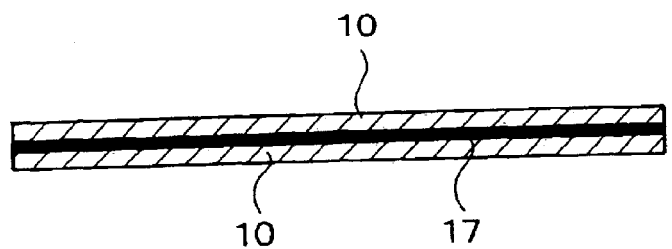
FIG. 25 is a sectional view showing a first mode of use of the electromagnetic wave absorber according to the invention.

Examples of forms in use of the electromagnetic wave absorber according to any one of the first, second, third and fourth embodiments will be described below. FIG. 25 shows an example in which a laminate of sheet-like electromagnetic wave absorbers 10 is used. In FIG. 25, the sheet-like electromagnetic wave absorbers 10 are integrated with each other by an interlayer adhesive agent 17. Although this example shows the case where sheets of electromagnetic wave absorbers 10 cut into a predetermined size are laminated, the invention may be also applied to the case where folded pieces of a long sheet of electromagnetic wave absorber 10 are laminated. For example, an ordinary adhesive agent such as an epoxy resin, a polyamide resin, a vinyl resin or synthetic rubber can be used as the interlayer adhesive agent 17. Alternatively, the aforementioned electromagnetic wave absorbing high-molecular material may be used as the interlayer adhesive agent 17.

Figure 26:
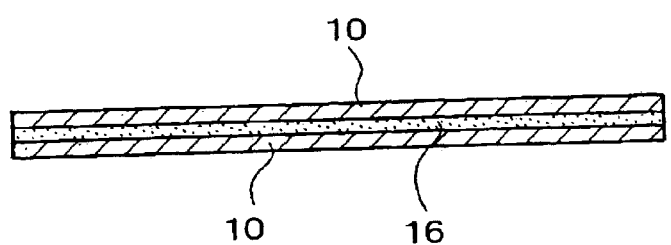
FIG. 26 is a sectional view showing a second mode of use of the electromagnetic wave absorber according to the invention.

FIG. 26 shows an example in which sheet-like electromagnetic wave absorbers 10 are laminated while a layer of incombustible fine particles 16 is interposed between layers of the electromagnetic wave absorbers 10.

Figure 27:
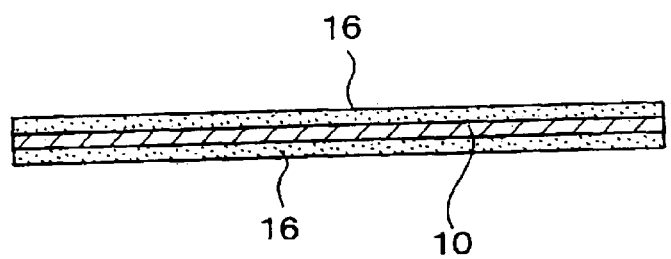
FIG. 27 is a sectional view showing a third mode of use of the electromagnetic wave absorber according to the invention.

FIG. 27 shows an example in which one or each of opposite surfaces of a sheet-like electromagnetic wave absorber 10 is coated with incombustible fine particles. 16. As an adhesive agent used for the coating, an ordinary adhesive agent may be used or the aforementioned electromagnetic wave absorbing high-molecular material may be used.

Figure 28:
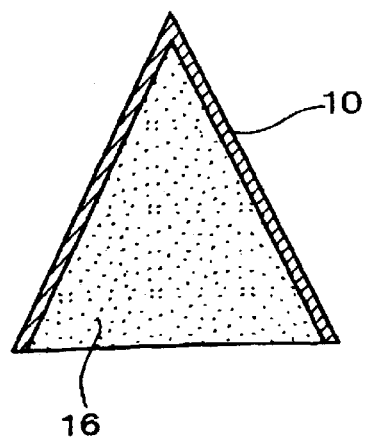
FIG. 28 is a sectional view showing a fourth mode of use of the electromagnetic wave absorber according to the invention.

FIG. 28 shows an example in which a sheet-like electromagnetic wave absorber 10 is processed into a three-dimensional shape such as a conical shape or a pyramid shape and a hollow portion of the three-dimensional shape is filled with incombustible fine particles 16.

Figure 29:
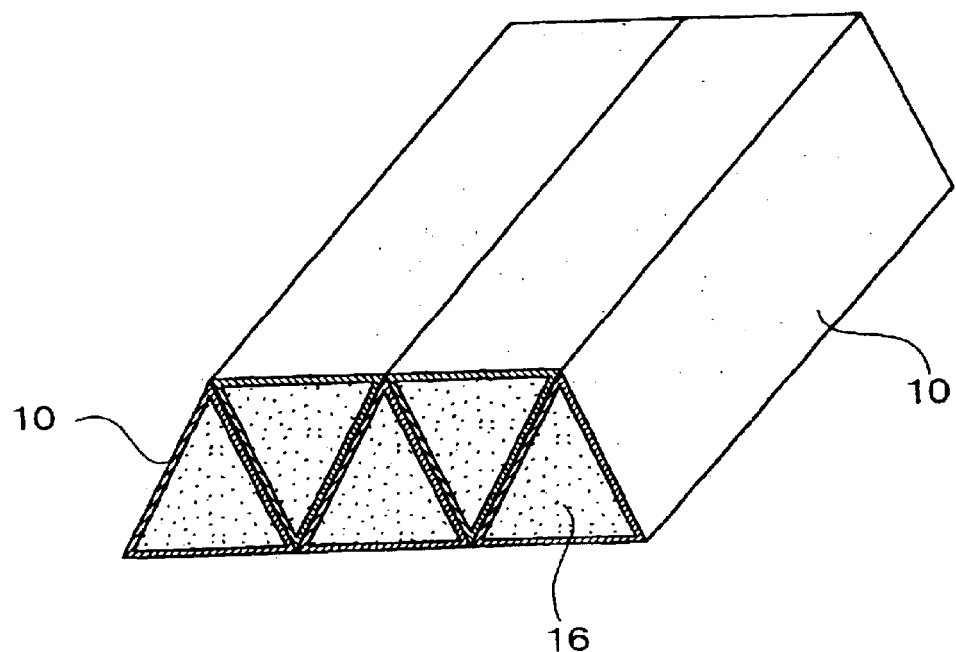
FIG. 29 is a sectional view showing a fifth mode of use of the electromagnetic wave absorber according to the invention.

FIG. 29 shows an example in which each of sheet-like electromagnetic wave absorbers 10 is processed into a prism have a sectional shape such as a polygonal shape having three or more sides, a circular shape or an elliptic shape and a hollow portion of each prism is filled with incombustible fine particles 16. In FIG. 29, an aggregate of a large number of such prisms is used.

Figure 30:
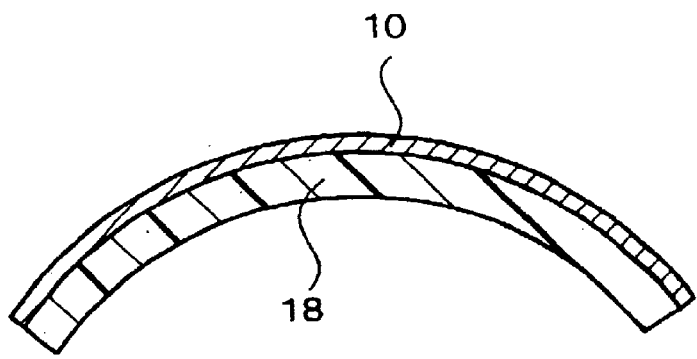
FIG. 30 is a sectional view showing a sixth mode of use of the electromagnetic wave absorber according to the invention.

FIG. 30 shows an example in which a sheet-like electromagnetic wave absorber 10 is used in combination with any other member 18 such as a synthetic resin, rubber, fabric or felt. In FIG. 30, the sheet-like electromagnetic wave absorber 10 is stuck to the other member 18 by means of molding, bonding, etc. For example, the combination can be molded into any shape such as a pat shape, a cap shape, an apron shape or a supporter shape.

Figure 31:
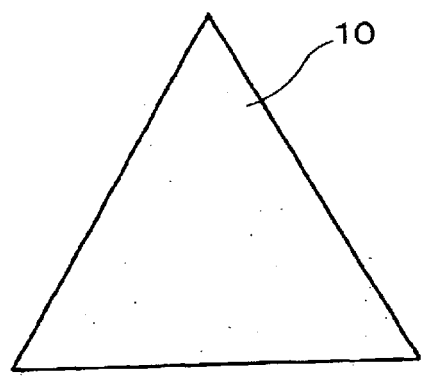
FIG. 31 is a plan view of the electromagnetic wave absorber used in a seventh mode of use of the electromagnetic wave absorber according to the invention.
Figure 32:
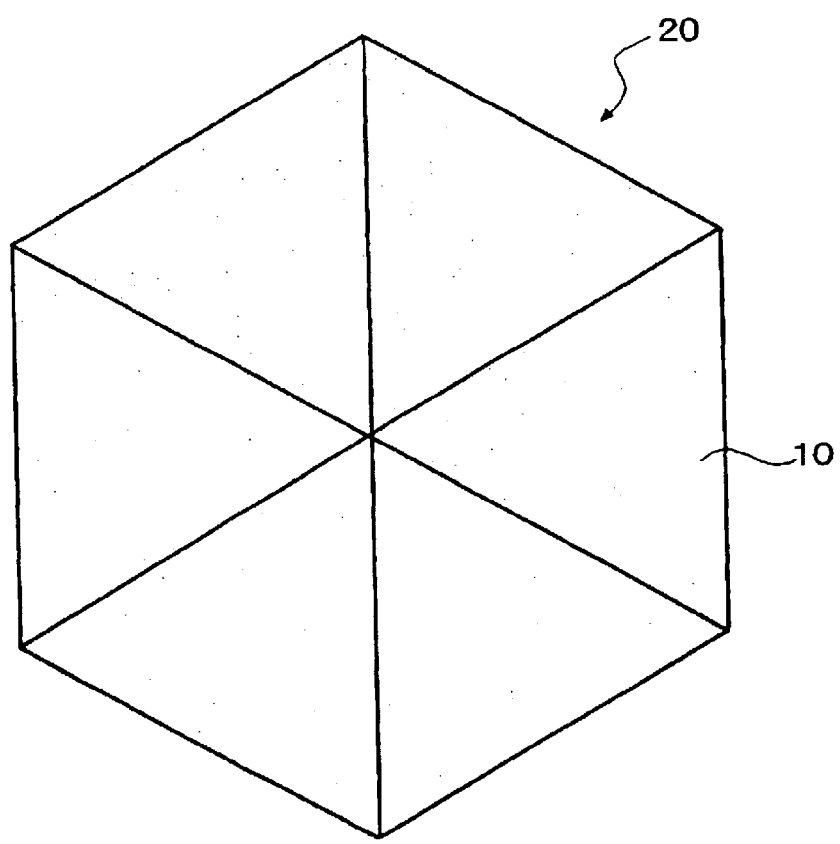
FIG. 32 is a plan view of an aggregate of electromagnetic wave absorbers.
Figure 33:
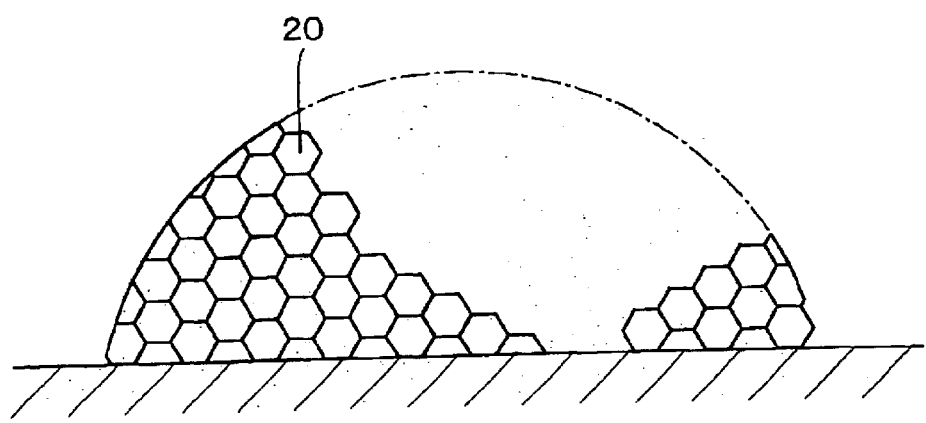
FIG. 33 is a partly front view of a Fuller dome constructed by aggregates of electromagnetic wave absorbers depicted in FIG. 32.

FIGS. 31 to 33 show an example in which a combination of sheet-like electromagnetic wave absorbers 10 having gas-permeability and see-through characteristic as described above is used as a constructional material. In this example, six triangular sheet-like electromagnetic wave absorbers 10 each formed to have an optional size as shown in FIG. 31 are combined to produce one hexagonal plate-like aggregate 20 as shown in FIG. 32.

For example, as shown in FIG. 33, a plurality of such aggregate 20 are used as constructional materials for constructing a Fuller dome structure. Although the way of using the plate-like aggregates 20 is not shown, the plate-like aggregates 20 are fitted into a lightweight frame or stuck to thermal insulating boards or reinforcing boards of the same shape. Although this example has shown the case where the aggregates are used as constructional materials for constructing a Fuller dome structure, the invention may be also applied to the case where the aggregates are used as constructional materials for constructing a side wall, a ceiling wall, a floor wall, a partition wall, etc. in an electromagnetic wave shielded space in a building, an institution, a factory, etc. In addition, composite boards each obtained by sticking the aggregate 20 to a thermal insulating board can be used as constructional materials for constructing a house in order to provide a sheltered space to a person hypersensitive to electromagnetic wave. Although this example has shown the case where triangular electromagnetic wave absorbers 10 are combined to produce a hexagonal aggregate 20, the invention may be also applied to the case where quadrangular or hexagonal electromagnetic wave absorbers 10 are combined to produce an aggregate used as a constructional material.

Figure 34:
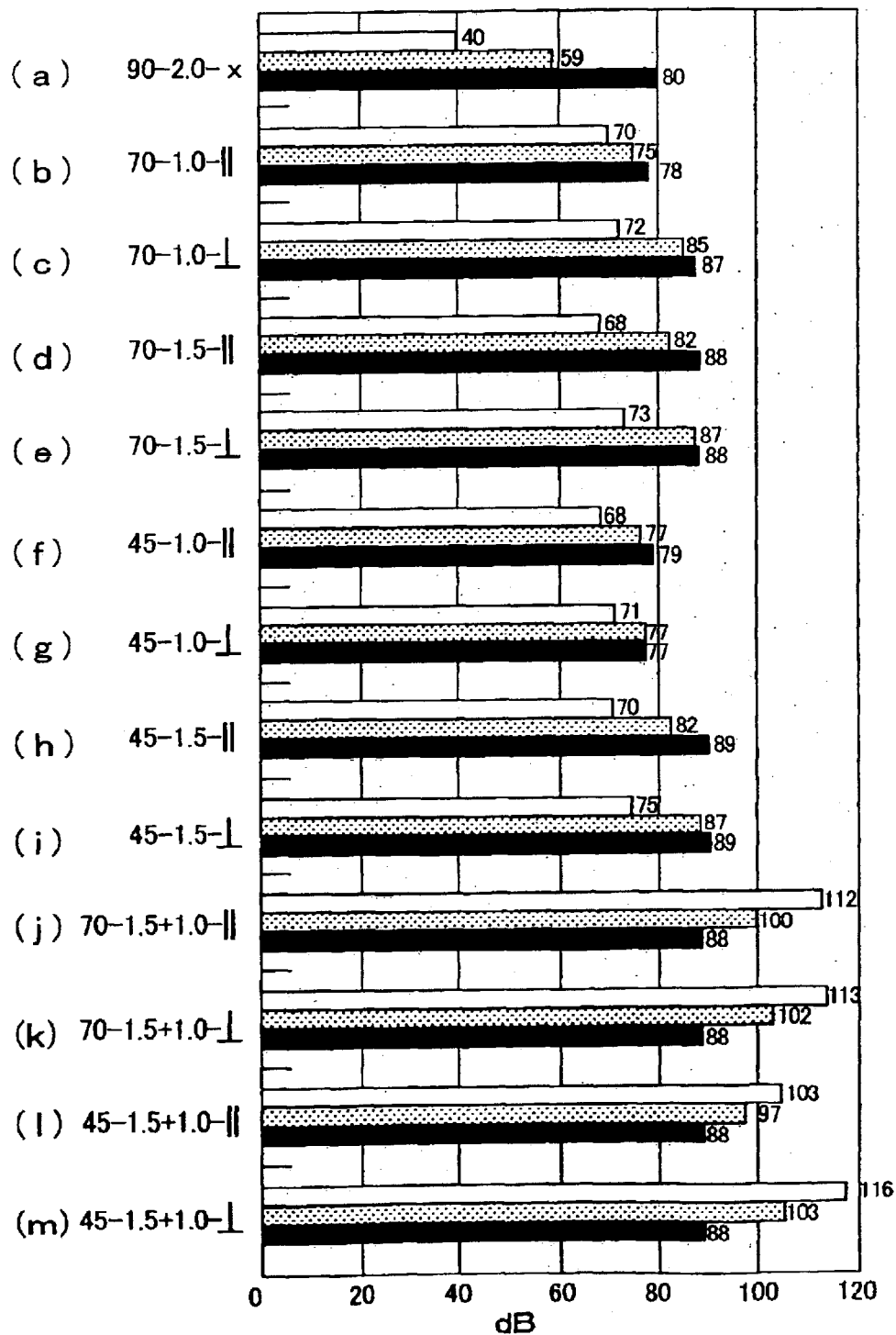
FIG. 34 is a graph showing electric field shielding characteristic of the electromagnetic wave absorber according to the invention.
Figure 35:
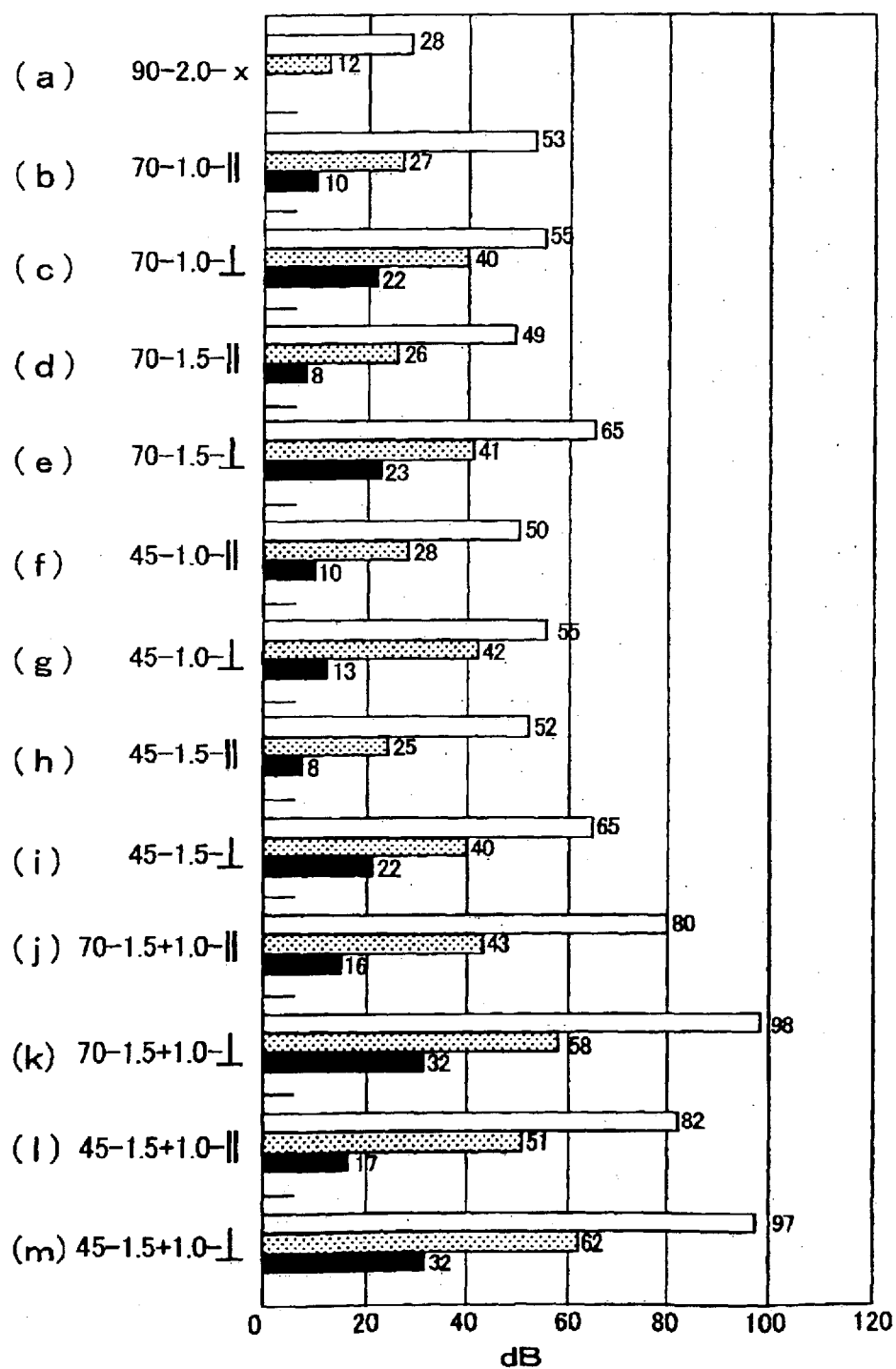
FIG. 35 is a graph showing magnetic field shielding characteristic of the electromagnetic wave absorber due to improvement of conductivity according to the invention.

FIG. 34 is a graph showing electric field shielding characteristic of the electromagnetic wave absorber according to the invention at each of frequencies 10 MHz, 100 MHz and 1 GHz. FIG. 35 is a graph showing magnetic field shielding characteristic of the electromagnetic wave absorber at each of the same frequencies. These pieces of data shown in FIGS. 34 and 35 are values measured by a KEC method. The KEC method is intended for evaluation in near field. When a pair of micro-antennas such as micro monopole antennas or loop antennas are used, both electric field shielding characteristic and magnetic field shielding characteristic can be measured.

The conditions of respective samples shown in FIGS. 34 and 35 are as follows.

Sample (a):

The axial direction of each pore 2 is inclined at 90° to the planes 4a and 4b as shown in FIG. 12. The sample is 2.0 mm thick.

Sample (b):

The inclination angle of each pore 2 to the planes 4a and 4b is 70° as shown in FIG. 11. The sample is 1.0 mm thick. The direction of each pore 2 is parallel to a polarization plane of electromagnetic wave.

Sample (c):

The inclination angle is 70°. The sample is 1.0 mm thick. The direction of each pore 2 is perpendicular to a polarization plane of electromagnetic wave.

Sample (d):

The inclination angle is 70°. The sample is 1.5 mm thick. The direction of each pore 2 is parallel to a polarization plane of electromagnetic wave.

Sample (e):

The inclination angle is 70°. The sample is 1.5 mm thick. The direction of each pore 2 is perpendicular to a polarization plane of electromagnetic wave.

Sample (f):

The inclination angle is 45°. The sample is 1.0 mm thick. The direction of each pore 2 is parallel to a polarization plane of electromagnetic wave.

Sample (g):

The inclination angle is 45°. The sample is 1.0 mm thick. The direction of each pore 2 is perpendicular to a polarization plane of electromagnetic wave.

Sample (h):

The inclination angle is 45°. The sample is 1.5 mm thick. The direction of each pore 2 is parallel to a polarization plane of electromagnetic wave.

Sample (i):

The inclination angle is 45°. The sample is 1.5 mm thick. The direction of each pore 2 is perpendicular to a polarization plane of electromagnetic wave.

Sample (j):

The inclination angle is 70°. The sample is a laminate of a sheet 1.5 mm thick and a sheet 1.0 mm thick. The direction of each pore 2 is parallel to a polarization plane of electromagnetic wave.

Sample (k):

The inclination angle is 70°. The sample is a laminate of a sheet 1.5 mm thick and a sheet 1.0 mm thick. The direction of each pore 2 is perpendicular to a polarization plane of electromagnetic wave.

Sample (l):

The inclination angle is 45°. The sample is a laminate of a sheet 1.5 mm thick and a sheet 1.0 mm thick. The direction of each pore 2 is parallel to a polarization plane of electromagnetic wave.

Sample (m):

The inclination angle is 40°. The sample is a laminate of a sheet 1.5 mm thick and a sheet 1.0 mm thick. The direction of each pore 2 is perpendicular to a polarization plane of electromagnetic wave.

As is obvious from FIGS. 34 and 35, any one of the samples has high electric field shielding characteristic and high magnetic field shielding characteristic in a wide frequency range of 10 MHz to 1 GHz. Especially, electromagnetic wave absorbers formed so that the direction of each pore is inclined to the planes have excellent shielding characteristic. Further especially, electromagnetic wave absorbers each constituted by a laminate of two sheets have excellent shielding characteristic. Most of conventional electromagnetic wave absorbers may have slightly high electric field shielding characteristic but cannot be expected to have good magnetic field shielding characteristic. On the other hand, electromagnetic wave absorbers according to the invention are excellent both in electric field shielding characteristic and in magnetic field shielding characteristic and can be preferably used for electromagnetic wave shielding in a microwave frequency band.

Figure 36:
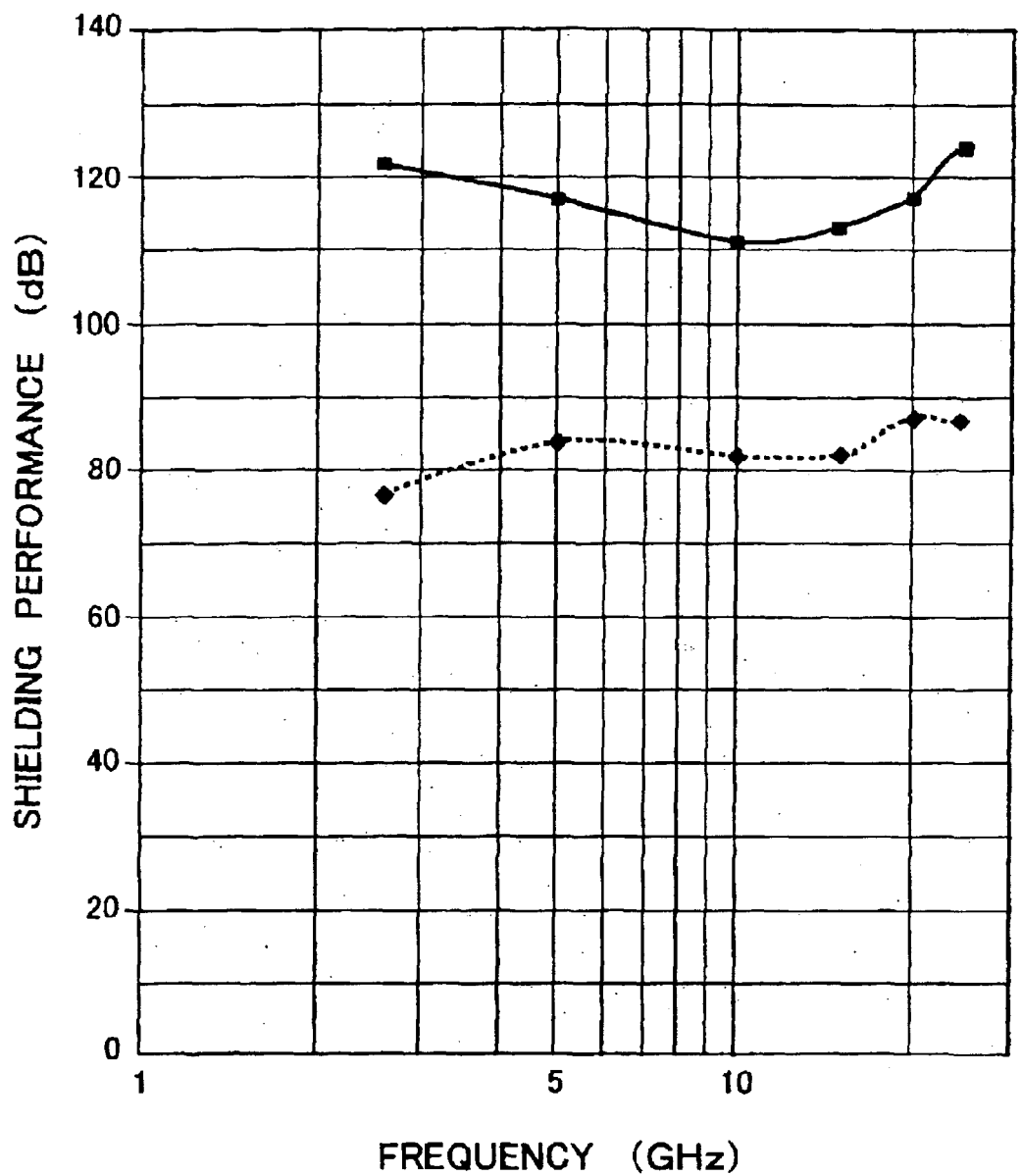
FIG. 36 is a graph showing shielding characteristic in the case where two sheets of electromagnetic wave absorbers according to the invention overlap each other.
Figure 37:
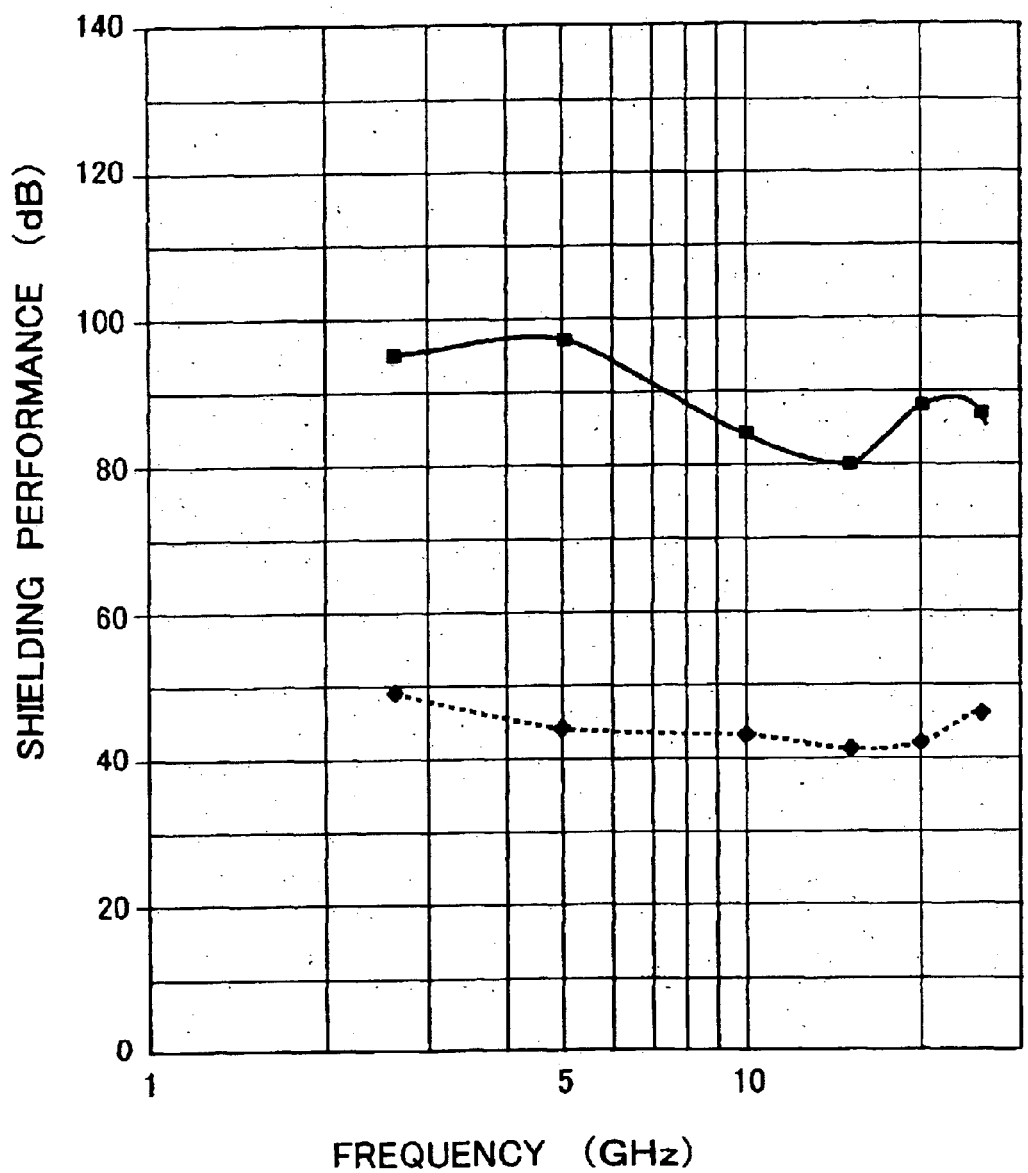
FIG. 37 is a graph showing shielding characteristic in the case where one sheet of the electromagnetic wave absorber according to the invention is used.

FIG. 36 is a characteristic graph showing shielding performance in the case where two sheet-like electromagnetic wave absorbers each having a honeycomb structure shown in FIGS. 10 and 11 and having a thickness of 1.8 mm and a size of 21.4 cm×26.6 cm are laminated. FIG. 37 is a characteristic graph showing shielding performance in the case where one sheet-like electromagnetic wave absorber the same as in FIG. 36 is used.

Shielding performance is measured by a method according to MIL-STD-285. In each of FIGS. 36 and 37, the solid line shows a characteristic curve where the direction of each pore 2 is parallel to a polarization plane of electromagnetic wave, and the broken line shows a characteristic curve where the direction of each pore 2 is perpendicular to polarization plane of electromagnetic wave. As is obvious from FIGS. 36 and 37, the electromagnetic wave absorber according to the invention has good shielding performance even in the case where the frequency is higher than 20 GHz. Especially as shown in FIG. 36, when a laminate of sheets of electromagnetic wave absorbers is used, excellent shielding performance can be obtained.

Figure 38:
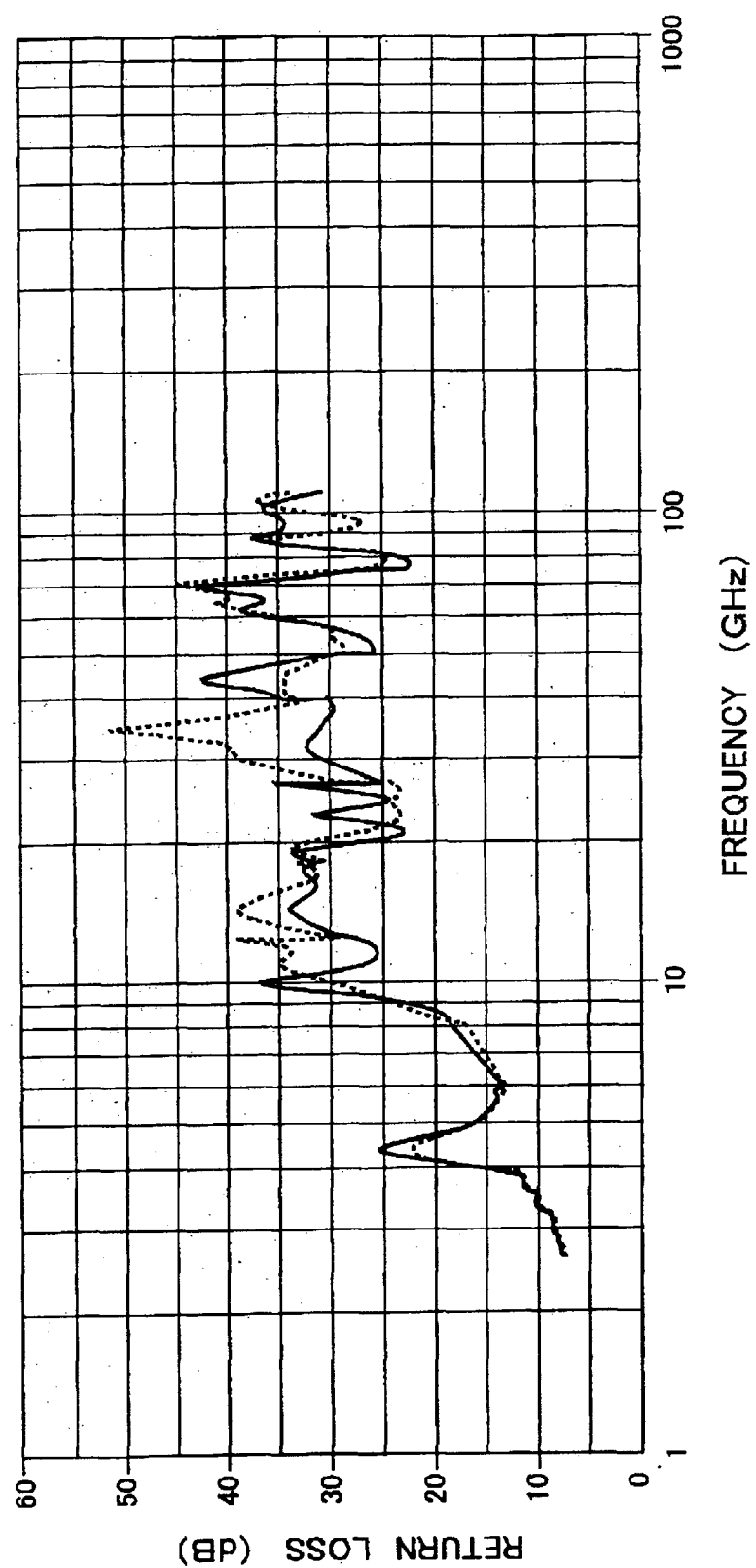
FIG. 38 is a graph showing return loss characteristic of the electromagnetic wave absorber having convex portions and using the porous ceramic according to the invention.

FIG. 38 is a characteristic graph showing electromagnetic wave return loss of an electromagnetic wave absorber which has a large number of convex portions each formed to have a height of 3 cm and a diameter of 5 cm and which is formed from a sheet-like electromagnetic wave absorber having a honeycomb structure shown in FIGS. 19 and 20, made of a porous ceramic filled with graphite-carrying incombustible fine particles 16 and having a size of 60 cm×60 cm.

Characteristic is measured by an arch method. Return losses are measured in a longitudinal direction and in a transverse direction respectively in consideration of variations in density of the porous ceramic and shape of the convex portions. In FIG. 38, the solid line shows a characteristic curve where the direction of each pore 2 is parallel to a polarization plane of electromagnetic wave, and the broken line shows a characteristic curve where the direction of each pore 2 is perpendicular to polarization plane of electromagnetic wave.

In the case shown in FIG. 38, an excellent absorbing characteristic is obtained when the frequency of electromagnetic wave is in a range of from 30 GHz to 40 GHZ. The frequency band of electromagnetic wave as a subject of shielding can be specified by adjusting the shape, size and distribution of the convex portions, the density of the porous ceramic, the thickness of the electromagnetic wave absorber, etc. In this example, because the inside of the electromagnetic wave absorber is filled with the incombustible fine particles 16, the electromagnetic wave absorber has heat resistance of 1,300° C. to 1,800° C.

Figure 39:
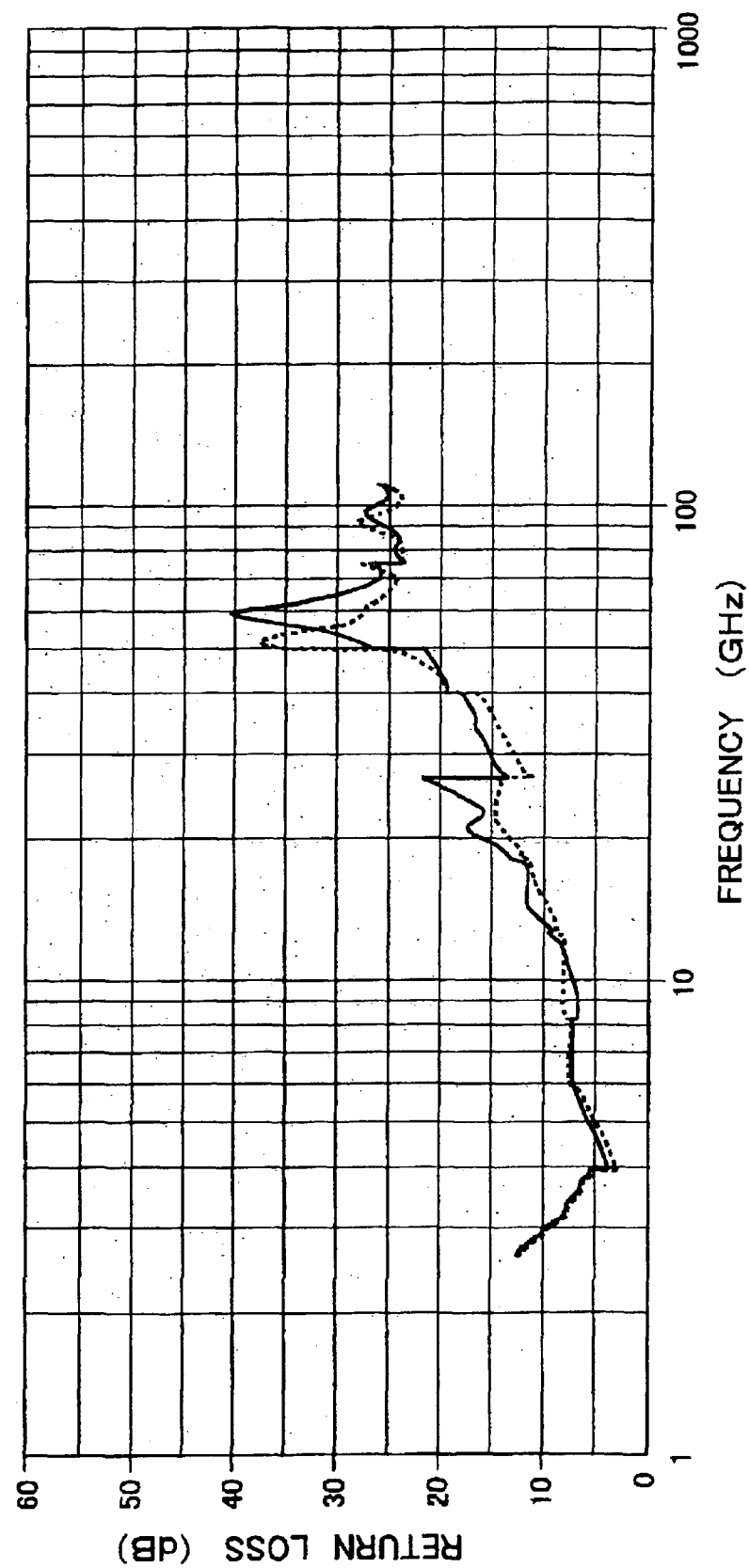
FIG. 39 is a graph showing return loss characteristic of the sheet-like electromagnetic wave absorber using the porous ceramic according to the invention.
Figure 40:
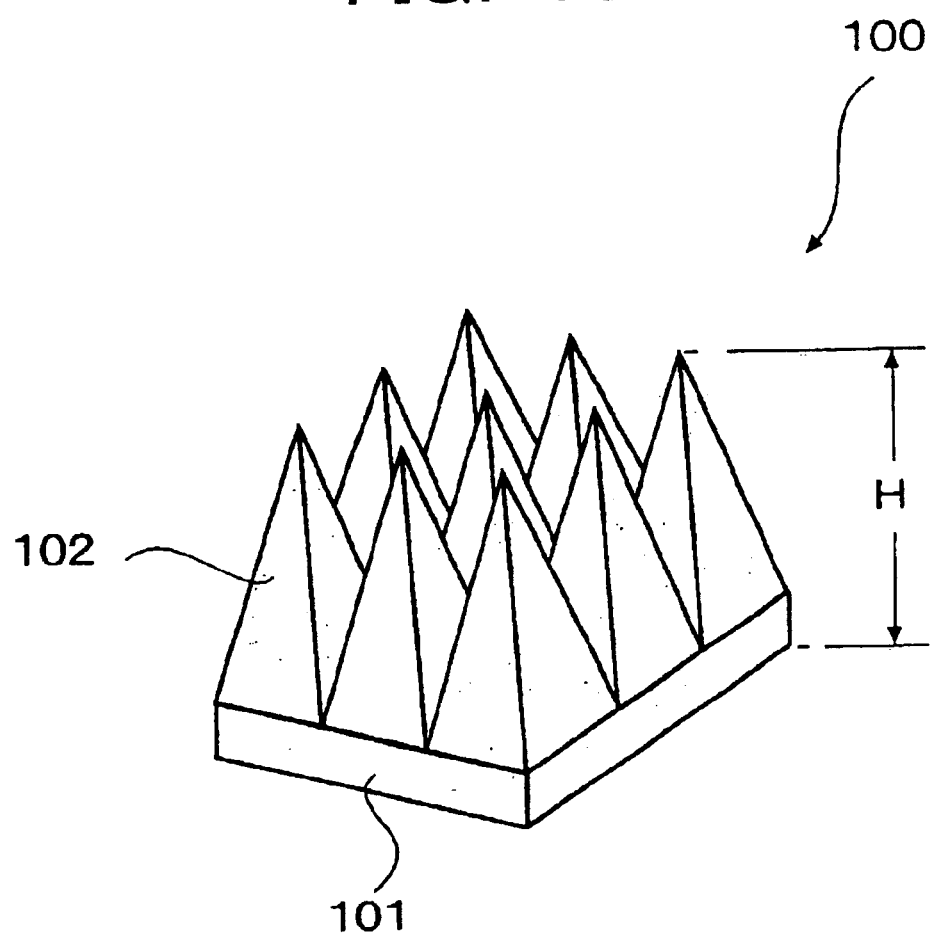
FIG. 40 is a perspective view of a conventional electromagnetic wave absorber.

FIG. 39 is a characteristic graph showing electromagnetic wave return loss of a sheet-like electromagnetic wave absorber having a honeycomb structure shown in FIGS. 19 and 20, made of a porous ceramic filled with graphite-carrying incombustible fine particles 16 and having a thickness of 8 mm and a size of 60 cm×60 cm.

Characteristic is measured by an arch method. Return losses are measured in a longitudinal direction and in a transverse direction respectively in consideration of variations in density of the porous ceramic. In FIG. 39, the solid line shows a characteristic curve where the direction of each pore 2 is parallel to a polarization plane of electromagnetic wave, and the broken line shows a characteristic curve where the direction of each pore 2 is perpendicular to polarization plane of electromagnetic wave.

In the case shown in FIG. 39, an excellent absorbing effect is obtained when the frequency of electromagnetic wave is 60 GHz. The electromagnetic wave absorber is preferably used as an electromagnetic wave absorber adapted to 60 GHz in a rear-end collision preventing apparatus or an office LAN. When the convex portions are not formed, the frequency band of electromagnetic wave as a subject of absorbing can be specified by adjusting the particle size and density of the porous ceramic and the thickness of each layer, etc. Also in this example, because the inside of the electromagnetic wave absorber is filled with the incombustible fine particles 16, the electromagnetic wave absorber has heat resistance of 1,300° C. or higher.

As is obvious from results of FIGS. 38 and 39 that the electromagnetic wave absorber according to the invention has an electromagnetic wave absorbing function as well as an electromagnetic wave reflecting function for electromagnetic shielding. The concept "electromagnetic wave absorbers" used in this specification includes an electromagnetic wave absorber having an electromagnetic wave reflecting function for electromagnetic shielding.

Although the embodiment has shown the case where a sheet-like porous substrate cut from a porous block having a honeycomb structure shown in FIG. 1 is used, the invention is not limited thereto. An effect equal to the aforementioned effect can be also obtained when a sheet-like porous substrate cut from a porous block having another structure shown in FIG. 2 or 3 is used.

For example, the electromagnetic wave absorber according to the invention can be applied to the following extensive fields:

(1) constructional materials for constructing an electromagnetic anechoic chamber, a high-rise intelligent building, an executive room, an accountants' room, a computer room, a production control room of a factory, a train traffic control room, etc.;

(2) vehicles such as an airplane, a train, an automobile, a ship, etc.;

(3) various kinds of apparatuses such as a communication apparatus, an OA apparatus, a household appliance, a measuring apparatus, an electric apparatus, a medical apparatus, etc.;

(4) shielded facilities such as a radar control tower, etc;

(5) protection of printed wiring boards, electronic parts, etc., (particularly when a gas-permeable electromagnetic wave absorber is used, a function equal to a heat sink (heat-radiating member) can be obtained together with the protecting function);

(6) heat sinks (heat-radiating members) using gas-permeability; and (7) members for protecting human bodies or the like (such as an OA apron, a cap for a person hypersensitive to electromagnetic wave, a helmet, a cover for protecting a medical apparatus such as a cardiac pacemaker, and a microwave oven cover for covering a microwave oven during the operation).

According to first means of the invention, there is provided an electromagnetic wave absorber including: a porous substrate having a large number of pores piercing the porous substrate; and an absorbent film formed on circumferential surfaces of the pores and constituted by a mixture of an electromagnetic wave absorbing filler and an electromagnetic wave absorbing high-molecular material, wherein the pores are not blocked with the absorbent film so that the pores are permeable to gas.

According to second means of the invention, there is provided an electromagnetic wave absorber including: a porous substrate having a large number of pores piercing the porous substrate; and incombustible or flame-retardant particles having pores into which filamentary carbon adheres, the pores of the porous substrate being filled with the incombustible or flame-retardant particles.

According to third means of the invention, there is provided an electromagnetic wave absorber including: a porous substrate having a large number of pores piercing the porous substrate; an absorbent film formed on circumferential surfaces of the pores and constituted by a mixture of an electromagnetic wave absorbing filler and an electromagnetic wave absorbing high-molecular material; and incombustible or flame-retardant particles having pores into which filamentary carbon adheres, the absorbent film-coated pores of the porous substrate being filled with the incombustible or flame-retardant particles.

The electromagnetic wave absorber configured as described above is high in electromagnetic wave absorbing performance, can be made thin and lightweight, can offer electromagnetic wave absorbing performance over a very broad range, is excellent in reliability, and can be applied to a broad technical field.

Because the electromagnetic wave absorber according to the first means has gas-permeability or (and) see-through characteristic, electromagnetic wave can be absorbed and cut off at any place requiring gas-permeability or see-through characteristic. In addition, the electromagnetic wave absorber may according to each of the second means and the third means have characteristic so that it has excellent incombustibility or flame retardancy.

What is claimed is:

1. An electromagnetic wave absorber which comprises a porous substrate having a large number of pores piercing the porous substrate; and an absorbent film formed on circumferential surfaces of said pores and comprising a mixture of an electromagnetic wave absorbing filler and an electromagnetic wave absorbing high-molecular material, wherein said pores are not blocked with said absorbent film so that said pores are permeable to gas.

2. An electromagnetic wave absorber which comprises a porous substrate having a large number of pores piercing the porous substrate; and incombustible or flame-retardant particles having pores into which filamentary carbon adheres, said pores of said porous substrate being filled with said incombustible or flame-retardant particles.

3. An electromagnetic wave absorber which comprises a porous substrate having a large number of pores piercing the porous substrate; an absorbent film formed on circumferential surfaces of said pores and comprising a mixture of an electromagnetic wave absorbing filler and an electromagnetic wave absorbing high-molecular material; and incombustible or flame-retardant particles having pores into which filamentary carbon adheres, said absorbent film-coated pores of said porous substrate being filled with said incombustible or flame-retardant particles.

4. An electromagnetic wave absorber according to any one of claims 1 through 3, wherein said porous substrate is made of either of an electromagnetic wave shielding material and an electromagnetic wave absorbing material.

5. An electromagnetic wave absorber according to any one of claims 1 through 3, wherein said absorbent film is comprises a laminate of layers of absorbent films different in electromagnetic wave absorbing filler content.

6. An electromagnetic wave absorber according to any one of claims 1 through 3, further comprising a thin layer containing electromagnetic wave absorbing metal or carbon and provided so as to overlap said absorbent film.

7. An electromagnetic wave absorber according to any one of claims 1 through 3, wherein said porous substrate has a honeycomb structure.

8. An electromagnetic wave absorber according to any one of claims 1 through 3, wherein an axial direction of each of said pores in said porous substrate is inclined to a plane of said porous substrate.

9. An electromagnetic wave absorber according to any one of claims 1 through 3, wherein said electromagnetic wave absorbing high-molecular material is a modified polyester resin comprising a copolymer of isobutyl methacrylate and butyl acrylate.

10. An electromagnetic wave absorber according to any one of claims 1 through 3, wherein said electromagnetic wave absorber is comprises a laminate of sheet-like electromagnetic wave absorbers.

11. An electromagnetic wave absorber according to claim 10, wherein said electromagnetic wave absorbers to be laminated are integrally bonded to one another by a modified polyester resin comprising a copolymer of isobutyl methacrylate and butyl acrylate.

12. An electromagnetic wave absorber according to any one of claims 1 through 3, wherein said electromagnetic wave absorber is coated with incombustible or flame-retardant particles having pores into which filamentary carbon adheres.

13. An electromagnetic wave absorber according to any one of claims 1 through 3, wherein: said electromagnetic wave absorber comprises a laminate of sheet-like electromagnetic wave absorbers; and incombustible or flame-retardant particles having pores into which filamentary carbon adheres are interposed between said sheet-like electromagnetic wave absorbers.

14. An electromagnetic wave absorber according to any one of claims 1 through 3, wherein: said electromagnetic wave absorber is processed three-dimensionally; and a hollow portion of said processed electromagnetic wave absorber is filled with incombustible or flame-retardant particles having pores into which filamentary carbon adheres.

15. An electromagnetic wave absorber according to any one of claims 1 through 3, wherein said electromagnetic wave absorber is disposed in the periphery of a printed wiring board mounted with electronic parts or in the periphery of electronic parts.

16. An electromagnetic wave absorber according to any one of claims 1 through 3, wherein said electromagnetic wave absorber is used as a constructional material.

* * * * *